(12) United States Patent
Kim et al.

(10) Patent No.: US 11,706,882 B2
(45) Date of Patent: Jul. 18, 2023

(54) DISPLAY APPARATUS AND TILED DISPLAY APPARATUS INCLUDING THE SAME

(71) Applicant: LG Display Co., Ltd., Seoul (KR)

(72) Inventors: SunWoong Kim, Paju-si (KR); SeungSoo Yang, Paju-si (KR); ByungHyuck Seo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/565,884

(22) Filed: Dec. 30, 2021

(65) Prior Publication Data
US 2022/0210928 A1 Jun. 30, 2022

(30) Foreign Application Priority Data
Dec. 30, 2020 (KR) ...................... 10-2020-018 8188

(51) Int. Cl.
*H05K 5/00* (2006.01)
*H05K 5/02* (2006.01)
(52) U.S. Cl.
CPC ......... *H05K 5/0017* (2013.01); *H05K 5/0021* (2013.01); *H05K 5/0217* (2013.01)
(58) Field of Classification Search
USPC ....................................................... 361/730
See application file for complete search history.

(56) References Cited

U.S. PATENT DOCUMENTS

| | | | |
|---|---|---|---|
| 11,183,087 B1 * | 11/2021 | Timmins | G09F 9/3026 |
| 2019/0059166 A1 * | 2/2019 | Habeck | H05K 5/0217 |
| 2020/0205320 A1 * | 6/2020 | Kong | H05K 7/20972 |

FOREIGN PATENT DOCUMENTS

| | | |
|---|---|---|
| KR | 1999-0042016 U | 12/1999 |
| KR | 10-2017-0062714 A | 6/2017 |

* cited by examiner

*Primary Examiner* — Hung S. Bui
(74) *Attorney, Agent, or Firm* — Morgan, Lewis & Bockius LLP

(57) ABSTRACT

Disclosed are a display apparatus and a tiled display apparatus including the same, including a display panel and a support module configured to support the display panel, wherein the support module includes a body supporting the display panel, a plurality of support portions movably coupled to the body, a plurality of connection portions connected to the plurality of support portions, respectively, and a rotating portion connected to the plurality of connection portions and configured to move the plurality of support portions in an insertion direction toward an inside of the body or a protrusion direction toward an outside of the body. Since the display panel is easily attached to and detached from the frame, a time for replacement, repair, and installation work of the display panel may be reduced.

20 Claims, 25 Drawing Sheets

DISPLAY APPARATUS AND TILED DISPLAY APPARATUS INCLUDING THE SAME

CROSS-REFERENCE TO RELATED APPLICATIONS

This application claims the benefit of the Korean Patent Application No. 10-2020-0188188 filed on Dec. 30, 2020, which is hereby incorporated by reference as if fully set forth herein.

BACKGROUND

Technical Field

The present disclosure relates to a display apparatus for displaying an image and a tiled display apparatus including the same.

Discussion of the Related Art

In general, tiled display apparatuses are apparatuses installed in an indoor or outdoor exhibition hall, a stage, etc. To display various types of visual information, and have gradually been increased in size in line with the development of information technology. In recent years, a large screen is implemented by connecting a plurality of display panels to deliver images in the form of a large screen.

In a tiled display apparatus, one or more display panels are arranged in a matrix form in a quadrangular frame or housing having a predetermined width and length.

Such a tiled display apparatus is installed in such a manner of reinforcing a member for thickness adjustment on a rear surface of a display panel in order to prevent an occurrence of bright lines or dark lines between the display panels adjacent to each other vertically and horizontally.

Meanwhile, the tiled display apparatus not only takes a long time to install because a plurality of display panels should be coupled to a frame by bolts but also it is difficult to replace or repair because it is not easy to detachably attach only a broken display panel when one display panel is broken because a plurality of display panels are connected to each other.

SUMMARY

Accordingly, embodiments of the present disclosure are directed to providing a display apparatus and a tiled display apparatus including the same that substantially obviate one or more problems due to limitations and disadvantages of the related art.

An aspect of the present disclosure is directed to providing a display apparatus that facilitates assembly and disassembly of a display panel and a tiled display apparatus including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display apparatus comprises: a display panel; and a support module configured to support the display panel, wherein the support module includes: a body configured to support the display panel; a plurality of support portions movably coupled to the body; a plurality of connection portions connected to the plurality of support portions, respectively; and a rotating portion connected to the plurality of connection portions and configured to move the plurality of support portions in an insertion direction toward an inside of the body or a protrusion direction toward an outside of the body.

In another aspect, a tiled display apparatus comprises: a stand frame; and a plurality of display apparatuses individually tiled to the stand frame.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a portion of this application, illustrate embodiments of the disclosure and together with the description serve to explain various principles of the disclosure. In the drawings.

DETAILED DESCRIPTION

Figure 1A:
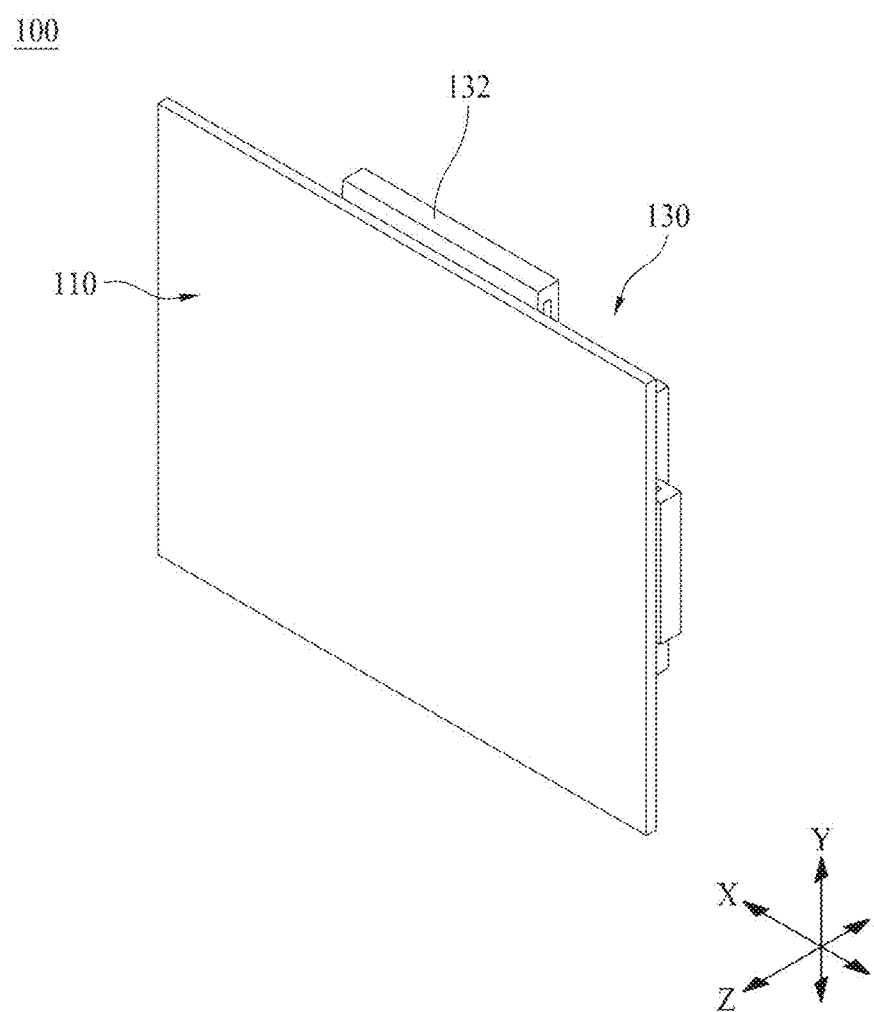
FIG. 1A is a schematic front perspective view of a display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present disclosure are used, another portion may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. May be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it may be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1B:
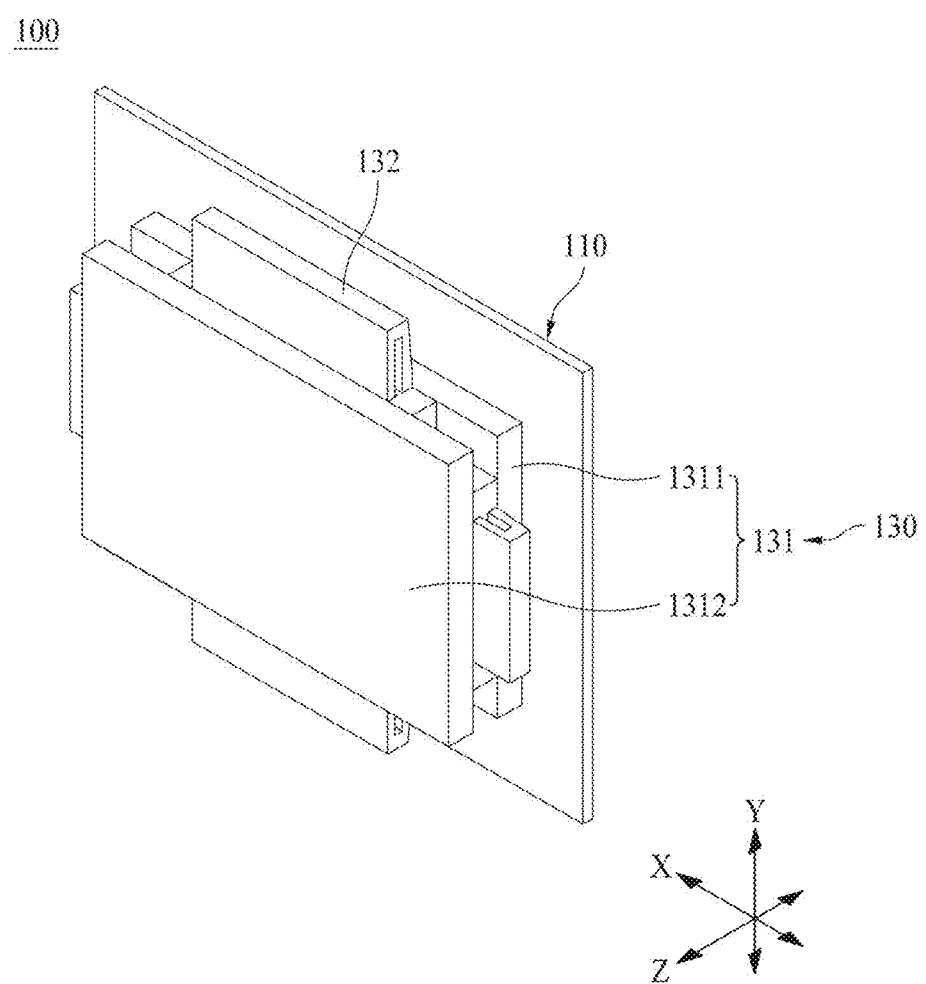
FIG. 1B is a schematic rear perspective view of a display apparatus according to an embodiment of the present disclosure.
Figure 2:
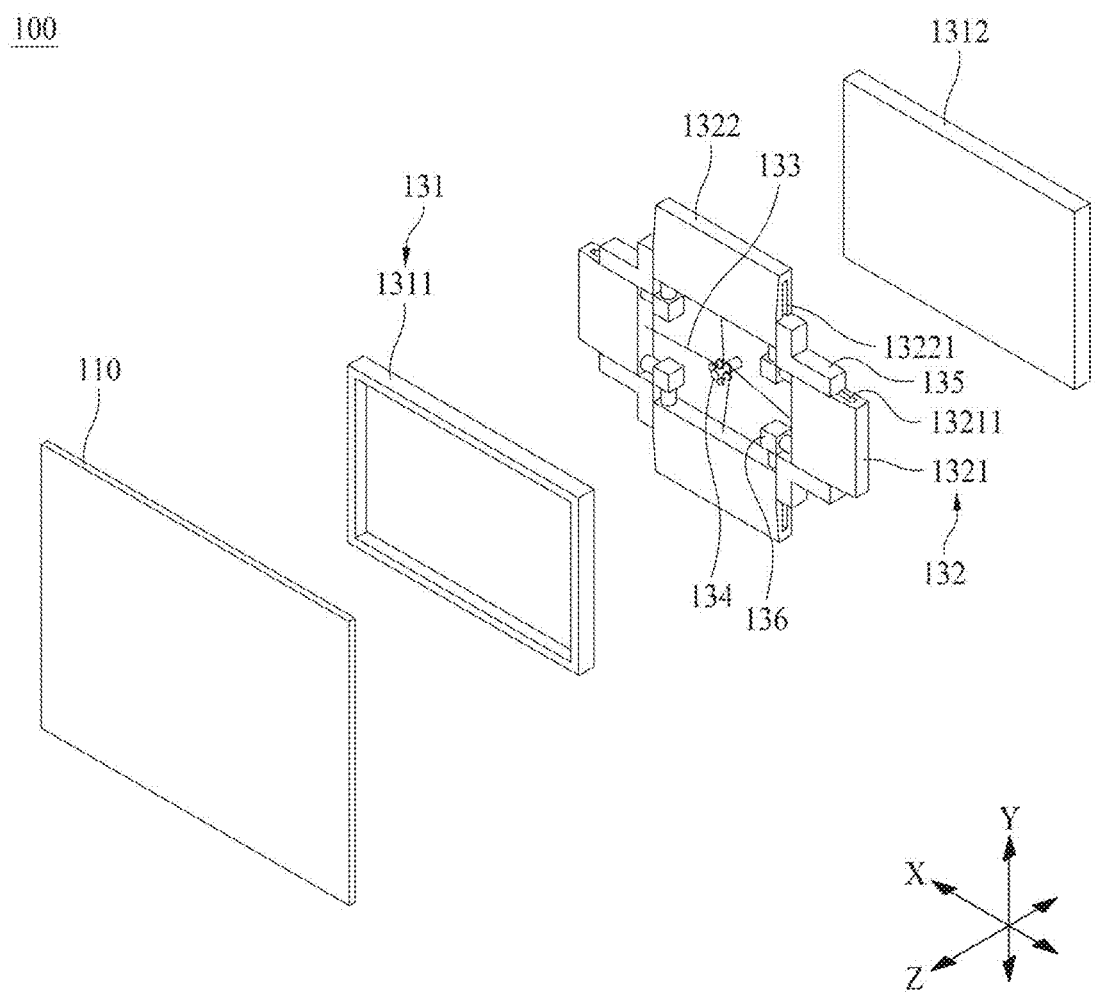
FIG. 2 is a schematic exploded perspective view of a display apparatus according to an embodiment of the present disclosure.
Figure 3A:
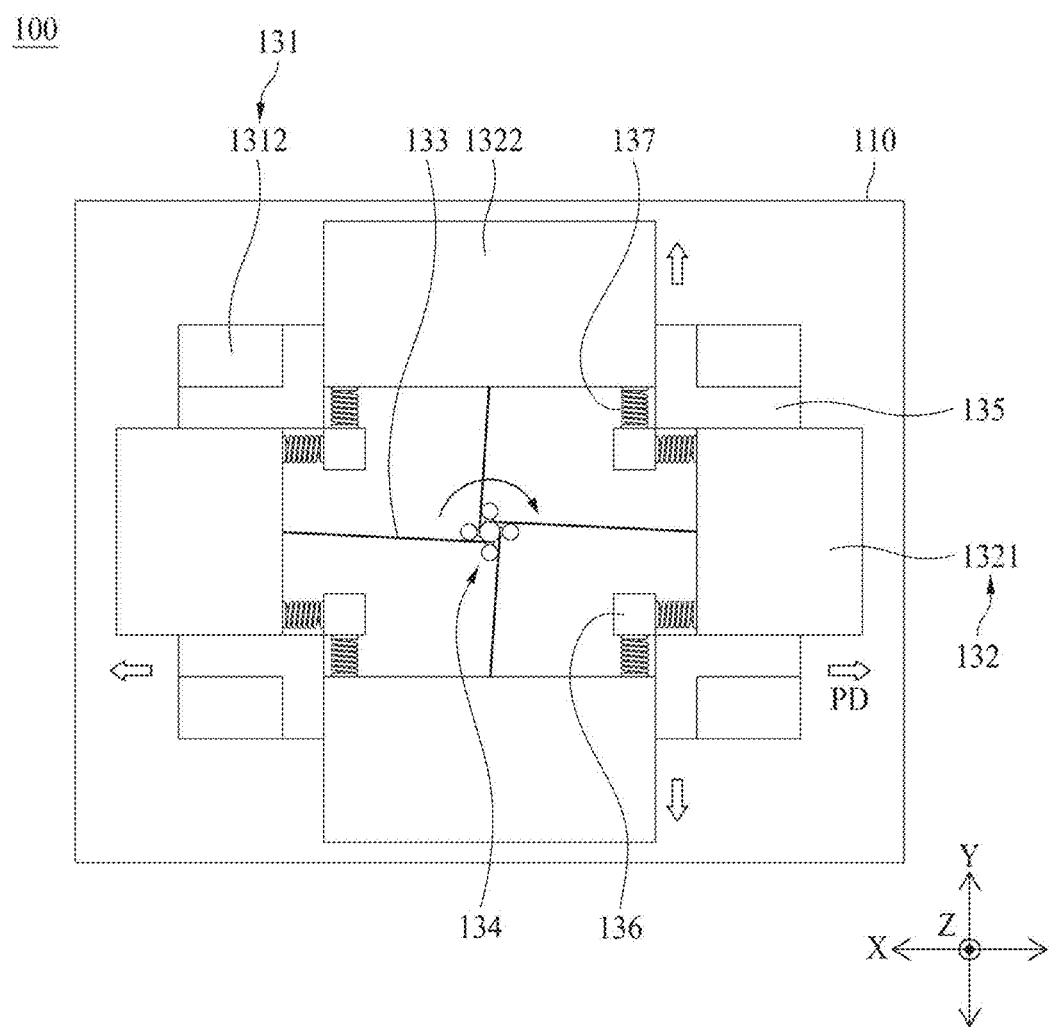
FIG. 3A is a schematic operation state view showing that a support portion of a display apparatus according to an embodiment of the present disclosure protrudes.
Figure 3B:
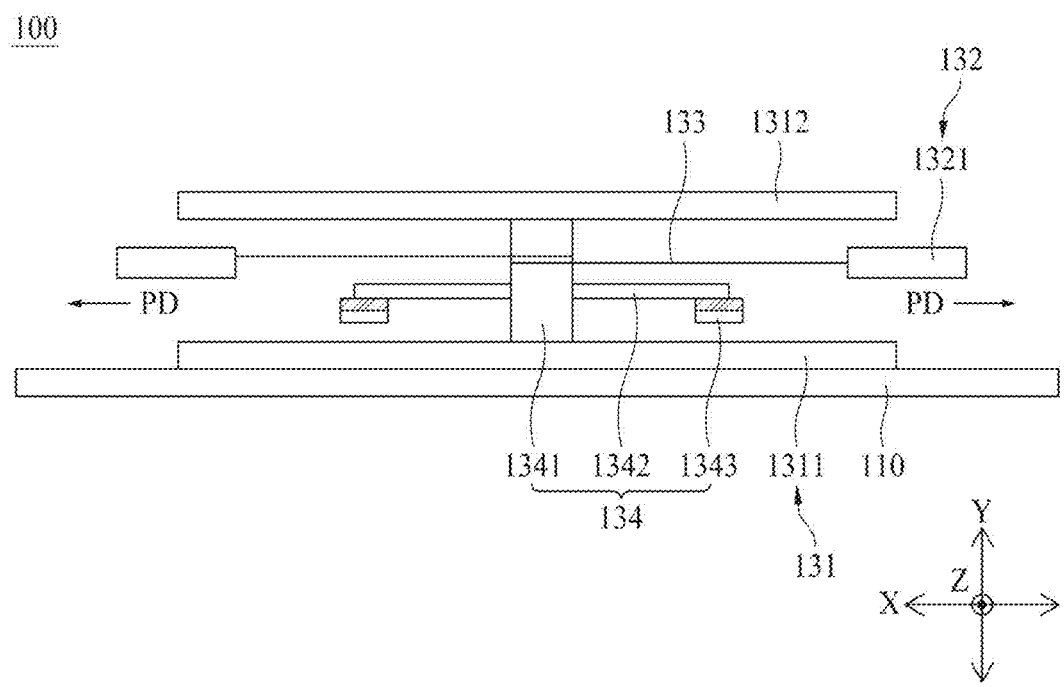
FIG. 3B is a schematic plan view of FIG. 3A.
Figure 4A:
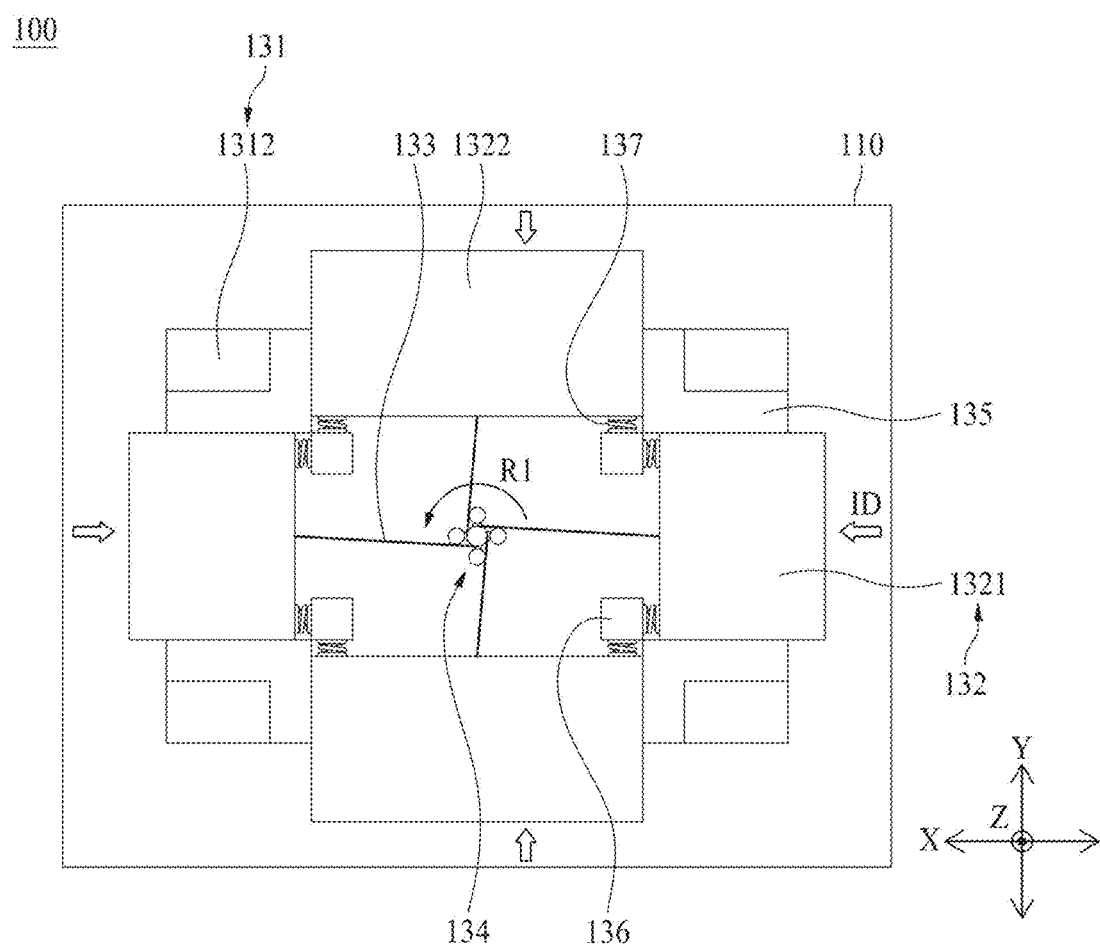
FIG. 4A is a schematic operation state view showing that a support portion of a display apparatus according to an embodiment of the present disclosure is inserted.
Figure 4B:
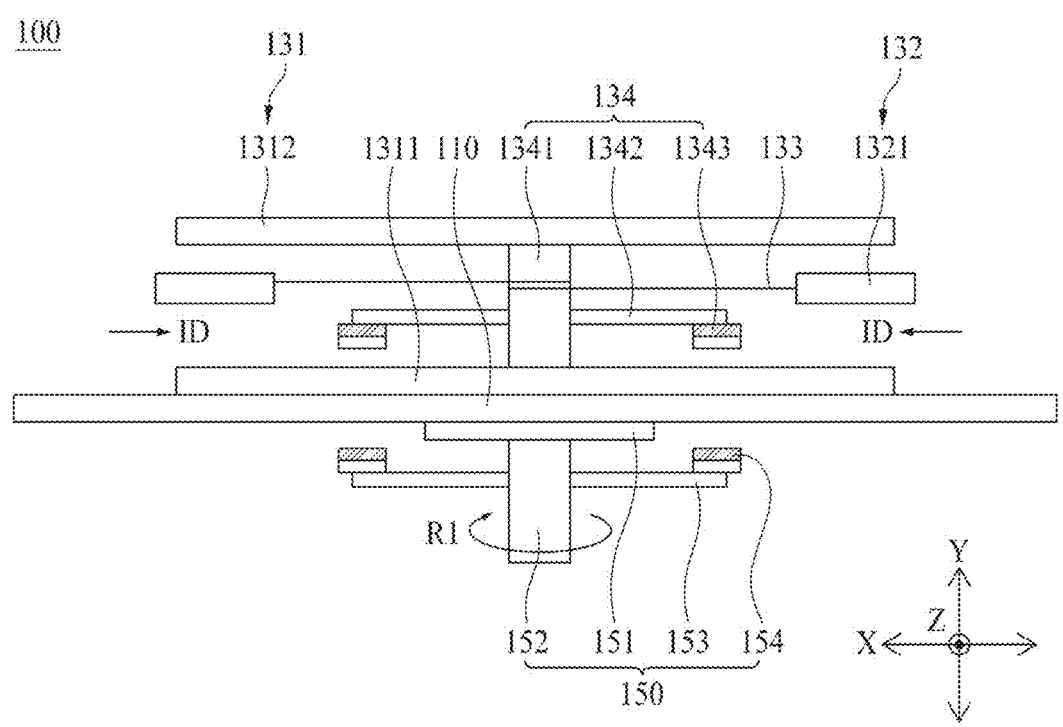
FIG. 4B is a schematic plan view of FIG. 4A illustrating a support mechanism of a display apparatus according to an embodiment of the present disclosure.

FIG. 1A is a schematic front perspective view of a display apparatus according to an embodiment of the present disclosure, FIG. 1B is a schematic rear perspective view of a display apparatus according to an embodiment of the present disclosure, FIG. 2 is a schematic exploded perspective view of a display apparatus according to an embodiment of the present disclosure, FIG. 3A is a schematic operation state view showing that a support portion of a display apparatus according to an embodiment of the present disclosure protrudes, FIG. 3B is a schematic plan view of FIG. 3A, FIG. 4A is a schematic operation state view illustrating that a support portion of a display apparatus according to an embodiment of the present disclosure is inserted, FIG. 4B is a schematic plan view of FIG. 4A illustrating a support mechanism of a display apparatus according to an embodiment of the present disclosure.

Referring to FIGS. 1 to 4B, a display apparatus 100 according to an embodiment of the present disclosure includes a display panel 110 and a support module 130 supporting the display panel 110. The support module 130 is for supporting the display panel 110 and includes a body 131, a support portion 132, a connection portion 133, and a rotating portion 134.

The display panel 110 may be provided in a rectangular shape as a whole. The display panel 110 may be coupled to the support module 130. As shown in FIG. 1B, the display panel 110 may be coupled to a front surface of a front plate 1311 of the body 131. The display panel 110 may be formed to have a size larger than that of the support module 130. Accordingly, the support module 130 disposed on a rear surface of the display panel 110 may not be recognized by a user positioned in front of the display panel 110.

The body 131 forms an overall appearance of the support module 130, and may be coupled to a rear surface of the display panel 110 to support the display panel 110. The body 131 may include a front plate 1311 and a back plate 1312.

The front plate 1311 may be coupled to the display panel 110. The front plate 1311 may be coupled to the rear surface of the display panel 110 by various methods such as adhesive or double-sided tape. The front plate 1311 may be disposed at the foremost of the support module 130 to form a front surface of the support module 130.

The back plate 1312 may be formed to have the same or similar size as the front plate 1311 and coupled to the rear surface of the front plate 1311. The back plate 1312 may be disposed at the rearmost of the support module 130 to form a rear surface of the support module 130. The back plate 1312 may be disposed to be spaced apart from the front plate 1311 by a predetermined distance. Accordingly, a predetermined space (or accommodation groove) may be formed between the back plate 1312 and the front plate 1311, and the support portion 132, the connection portion 133, and the rotating portion 134 may be placed in the space (or accommodation groove).

The support portion 132 may be movably coupled to the body 131. The support portion 132 is for supporting the display panel 110. For example, when the display apparatus 100 according to an embodiment of the present disclosure is coupled to a frame, the support portion 131 may be supported by the frame to support the display panel 110. The frame may be a stand frame 1100 to be described later.

The support portion 132 may be moved in an insertion direction ID toward the inside of the body 131 or a protrusion direction PD toward the outside of the body 131. The support portion 132 may be moved in the insertion direction ID through the connection portion 133 and the rotating portion 134. The support portion 132 may be moved in the protrusion direction PD by an elastic restoring force of an elastic member 137 of the support module 130 in a state in which the support portion 132 is moved in the insertion direction ID. In this case, the rotating portion 134 may also be rotated. Accordingly, more than half of the support portion 132 may be inserted into the body 131 as shown in FIG. 4A or may protrude from the body 131 as shown in FIG. 3A. As a result, the degree of protrusion of the support portion 132 with respect to the body 131 may vary.

When the support portion 132 is moved in the insertion direction ID, the display panel 110 may be easily removed (or separated) from the frame because the support portion 132 is spaced apart from the frame.

When the support portion 132 is moved in the protrusion direction PD, the display panel 110 may be easily attached (or installed) to the frame because the support portion 132 is supported on the frame.

The support portion 132 may include a pair of horizontal axis support members 1321 and a pair of vertical axis support members 1322. That is, the support portion 132 may be provided in plurality.

Each of the plurality of support portions 132 may be provided to decrease in size toward the outside (or in the protrusion direction PD). Accordingly, an interval between the plurality of support portions 132 and the rear surface of the display panel 110 may be adjusted according to the degree to which each of the plurality of support portions 132 protrudes from the body 131. Therefore, since the display apparatus 100 according to an embodiment of the present disclosure may be mounted according to a thickness of the frame even if a thickness of the frame is changed, mountability for a frame having various thicknesses may be improved.

Referring back to FIG. 2, the pair of horizontal axis support members 1321 may be disposed in parallel to the first direction (X-axis direction) and coupled to the plurality of guide frames 135 of the support module 130 so as to be movable in the first direction (X-axis direction). The plurality of guide frames 135 may be respectively coupled to the front plate 1311 and the back plate 1312. Accordingly, the pair of horizontal axis support members 1321 may protrude or may be inserted between the front plate 1311 and the back plate 1312 in the first direction (X-axis direction). The first direction (X-axis direction) may be a longer side longitudinal direction of the display panel 110.

The pair of vertical axis support members 1322 may be disposed parallel to a second direction (Y-axis direction) and coupled to the plurality of guide frames 135 so as to be movable in the second direction (Y-axis direction). Accordingly, the pair of vertical axis support members 1322 may protrude or may be inserted between the front plate 1311 and the back plate 1312 in the second direction (Y-axis direction). The second direction (Y-axis direction) is a direction perpendicular to the first direction (X-axis direction), and may be a shorter side longitudinal direction of the display panel 110. A third direction (Z-axis direction) may be a direction perpendicular to each of the first direction (X-axis direction) and the second direction (Y-axis direction), and may be a thickness direction of the display panel 110.

As shown in FIG. 4A, the pair of horizontal axis support member 1321 and the pair of vertical axis support member 1322 may be connected to the rotating portion 134 disposed in the center of the body 131 through the connection portion 133 and may be moved in the insertion direction ID as the rotating portion 134 rotates. Accordingly, more than a half of each of the pair of horizontal axis support members 1321 and the pair of vertical axis support members 1322 may be inserted into the body 131.

In order to protrude or insert the pair of horizontal axis support members 1321 and the pair of vertical axis support members 1322 from or into the body 131 as described above, the support module 130 may further include a plurality of guide frames 135, a plurality of support frames 136, and an elastic member 137.

The connection portion 133 serves to connect each of the plurality of support portions 132 and the rotating portion 134. One side of the connection portion 133 may be coupled to a rotation surface of the rotating portion 134, and the other side thereof may be connected to each of the plurality of support portions 135. The connection portion 133 may be a string, but is not limited thereto.

The connection portion 133 may be wound on the rotation surface when the rotating portion 134 rotates by an external force, thereby moving the support portion 135 connected to the other side in the insertion direction ID. When the external force acting on the rotating portion 134 is removed, the connection portion 133 may be released from the rotation surface as the support portion 135 is moved in the protrusion direction PD by an elastic restoring force of the elastic member 137 of the support module 130. Here, the external force may be a force applied by a worker who installs, repairs, or replaces the display apparatus 100.

The rotating portion 134 serves to move the plurality of support portions 132 in the insertion direction ID toward the inside of the body 131 or the protrusion direction PD toward the outside of the body 131. The rotating portion 134 is disposed in the center of the body 131 and may be connected to each of the plurality of support portions 132 through the connection portion 133. The rotating portion 134 may be rotated in the first rotation direction R1 (shown in FIG. 4A) by an external force. The display apparatus 100 according to an embodiment of the present disclosure may be provided to rotate the rotating portion 134 using a magnetic force (or magnetism) from the front side of the display panel 110. That is, the display apparatus 100 according to an embodiment of the present disclosure may rotate the rotating portion 134 in a non-contact manner using magnetic force (or magnetism). The rotating portion 134 may include a rotating shaft 1341, a plurality of rotating members 1342, and a plurality of magnetic members 1343.

As shown in FIGS. 3A and 3B, the rotating shaft 1341 may be disposed in the center of the body 131. This is to maintain the overall balance of the display apparatus 100 according to an embodiment of the present disclosure. If the rotating shaft 1341 is disposed to be biased toward any one of the support portions 132 unlike FIG. 3A, the center of gravity will be shifted to the side on which the rotating shaft 1341 is disposed, so it may be difficult to balance the display apparatus. Thus, in the display apparatus 100 according to the embodiment of the present disclosure, the overall balance may be maintained by arranging the rotating shaft 1341 in the center of the body 131.

The rotating shaft 1341 may be disposed in the thickness direction, that is, the third direction (Z-axis direction) of the display panel 110 so as to be rotatably coupled to each of the front plate 1311 and the back plate 1312.

The plurality of rotating members 1342 serve to rotate the rotating shaft 1341. The plurality of rotating members 1342 may be coupled to the rotating shaft 1341 to rotate together with the rotating shaft 1341. The plurality of rotating members 1342 may be arranged in a '+' shape about the rotating shaft 1341. Each of the plurality of rotating members 1342 may be formed to have a shorter length than the connection portion 133 and may be coupled to the rotating shaft 1341. Therefore, as shown in FIG. 4A, even if the plurality of support portions 132 move in the insertion direction ID, each of the plurality of rotating members 1342 may not collide with each of the plurality of support portions 132.

The plurality of magnetic members 1343 may serve to form magnetic force with the support mechanism 150 disposed on the front surface of the display panel 110 and may be coupled to ends of a plurality of rotating members 1342, respectively. For example, as shown in FIG. 3B, the plurality of magnetic members 1343 may be coupled to an end of the rotating member 1342 so as to be positioned between the rotating member 1342 and the front plate 1311. Accordingly, the plurality of magnetic members 1343 may be disposed closer to the display panel 110 than the rotating member 1342. This is to form a greater magnetic force with the support mechanism 150 disposed on the front surface of the display panel 110 than when the magnetic member is disposed on the same line as the rotating member. In the present disclosure, a hatched portion of the magnetic member 1343 is defined as an N pole, and a non-hatched portion is defined as an S pole. Although it has been described above that the plurality of magnetic members 1343 are coupled to the end of the rotating member 1342, the present disclosure is not limited thereto.

Meanwhile, as shown in FIG. 3B, the connection portion 133 may be connected to the rotation surface of the rotating shaft 1341 so as to be positioned between the rotating member 1342 and the back plate 1312. Accordingly, even if the rotation surface of the rotating shaft 1341 is rotated by an external force, the connection portion 133 may not interfere with the rotating member 1342 or the magnetic member 1343.

In addition, the connection portions 133 connected to the plurality of support portions 132 may be connected to the rotating shaft 1341 so as to be spaced apart from each other. Thus, even if the plurality of support portions 132 are moved in the insertion direction ID or the protrusion direction PD, the connection portions 133 may not be entangled or interfered with each other and may be easily wound on or unwound from the rotation surface of the rotating shaft 1341.

Referring to FIGS. 3A and 4A, the plurality of guide frames 135 serve to guide the plurality of support portions 132, respectively, and may be disposed on the edge of the body 131 so as to be spaced apart from the rotating portion 134. For example, as shown in FIG. 3A, the plurality of guide frames 135 are provided in the form of ']', '[', '538', and '539' and are disposed at the corners of the back plate 1312 provided in a rectangular shape to guide the plurality of support portions 132, respectively.

The plurality of guide frames 135 may include a protrusion (not shown) protruding in a direction toward the support portion 132, and the support portion 132 may include insertion grooves 13211 and 13221 (shown in FIG. 2) into which the protrusion is inserted. Accordingly, the plurality of support portions 132 may not be released in the third direction (Z-axis direction) due to the protrusions inserted into the insertion grooves 13211 and 13221 and may be moved in the insertion direction ID or the protrusion direction PD along the guide frame 135.

The plurality of support frames 136 serve to restrict movement of each of the plurality of support frames 136 so that the plurality of support portions 132 do not collide with the rotating portion 134. The plurality of support frames 136 may be formed in a rectangular plate shape, but is not limited thereto. The plurality of support frames 136 may be disposed closer to the rotating portion 134 than the plurality of support portions 132 and may be disposed on an imaginary line connecting a vertex of the back plate 1312 and the rotating portion 134. Accordingly, the plurality of support frames 136 may overlap with the plurality of support portions 132 in the first direction (X-axis direction) and the second direction (Y-axis direction).

The elastic member 137 may be disposed between the plurality of support frames 136 and the plurality of guide frames 135. The elastic member 137 may move each of the plurality of support portions 132 in a protrusion direction PD toward the outside of the body. The elastic member 137 may be a spring, but is not limited thereto, and may be another device having elasticity such as rubber that can be stretched or contracted.

The elastic member 137 may be contracted when the plurality of support portions 132 are moved in the insertion direction ID by the rotation of the rotating portion 134. As the elastic member 137 is extended by an elastic restoring force, the plurality of support portions 132 may be moved in the protrusion direction PD. As described above, the rotating portion 134 may be rotated by an external force.

The display apparatus 100 according to an embodiment of the present disclosure may further include a support mechanism 150 to rotate the rotating portion 134.

As shown in FIG. 4B, the support mechanism 150 is attached to the front surface of the display panel 110 so as to be coupled to the rotating portion 134 using a magnetic force in a non-contact manner and may be rotated in a first rotation direction by an external force (arrow direction R1), thereby rotating the rotating portion 134 disposed on the rear side of the display panel 110. The support mechanism 150 may include a compression member 151, a support rotating shaft 152, a plurality of support rotating members 153, and a plurality of support magnetic members 154.

The compression member 151 may be compressed on the front surface of the display panel 110. As the compression member 151 is pressed against the display panel 110, even if the display panel 110 is detached (or spaced apart) from the frame, the display panel 110 may be supported by the support mechanism 150 and may not fall. The compression member 151 may be formed of a rubber material to improve compression force but is not limited thereto.

The support rotating shaft 152 may be rotatably coupled to the compression member 151. The support rotating shaft 152 may be arranged in line with the rotating shaft 1341 of the rotating portion 134 so that the plurality of support magnetic members 154 may be arranged in positions corresponding to the plurality of magnetic members 1343 of the rotating portion 134, respectively.

The plurality of support rotating members 153 may be coupled to the support rotating shaft 152 to rotate together with the support rotating shaft 152. For example, the plurality of support rotating members 153 may be arranged in a '+' shape around the support rotating shaft 152. Each of the plurality of support rotating members 153 may be formed to have the same length as the plurality of rotating members 1342 and be coupled to the support rotating shaft 152.

The plurality of support magnetic members 154 serve to form a magnetic force with a plurality of magnetic members 1343 disposed on the rear side of the display panel 110 and may be coupled to ends of the plurality of support rotating members 153, respectively. For example, as shown in FIG. 4B, the plurality of support magnetic members 154 may be coupled to an end of the support rotating member 153 so as to be positioned between the support rotating member 153 and the display panel 110. Accordingly, the plurality of support magnetic members 154 may be disposed closer to the display panel 110 than the support rotating member 153. This is to form a greater magnetic force with the plurality of magnetic members 1343 disposed on the rear side of the display panel 110 compared to the case where the magnetic member is disposed on the same line as the rotating member. As shown in FIG. 4B, since the plurality of support magnetic members 154 are disposed to correspond to the plurality of magnetic members 1343, respectively, the plurality of support magnetic members 154 and the plurality of magnetic members 1343 may be disposed such that different polarities (N pole and S pole) face each other, so that an attractive force may be formed therebetween.

In this state, when the user rotates the support rotating shaft 152 in the first rotation direction (arrow direction R1), the plurality of support rotating members 153 coupled to the support rotating shaft 152 are rotated together, and the plurality of support magnetic members 154 coupled to the ends of the plurality of support rotating members 153 may also be rotated together in the first rotation direction (arrow direction R1). In this case, since the plurality of magnetic members 1343 coupled with the plurality of support magnetic members 154 by an attractive force in a non-contact manner may also be rotated in the first rotation direction (arrow direction R1), the plurality of rotating members 1342 and the rotating shaft 1341 (or rotation surface) to which the plurality of magnetic members 1343 are coupled may also be rotated in the first rotation direction (arrow direction R1). Accordingly, since the connection portion 133 connected to the rotating shaft 1341 (or the rotation surface) is wound around the rotation surface of the rotating shaft 1341, the plurality of support portions 132 may be moved in the insertion direction ID. Since the plurality of support portions 132 may be spaced apart from the frame as the plurality of support portions 132 are moved in the insertion direction ID, the display apparatus 100 according to an embodiment of the present disclosure may be easily removed from the frame (or may be separated).

Meanwhile, when the user separates the support mechanism 150 from the display panel 110 in a state in which the plurality of support portions 132 are moved in the insertion direction ID, the attractive force between the plurality of support magnetic members 154 and the plurality of magnetic members 1343 may be weakened or eliminated. Accordingly, the plurality of support portions 132 may be moved in the protrusion direction PD by extension based on the elastic restoring force of the elastic member 137 as shown in FIG. 3A and return to a position before being inserted into the body 131. Accordingly, since the plurality of support portions 132 may be in contact with the frame, the display apparatus 100 according to the embodiment of the present disclosure may be easily attached (or installed) to the frame. In this case, the connection portion 133 wound around the rotation surface of the rotating shaft 1341 may be released from the rotation surface of the rotating shaft 1341 as the plurality of support portions 132 move in the protrusion direction PD. In addition, the rotating shaft 1341 (or the rotation surface) may be rotated in a direction opposite to the first rotation direction (arrow direction R1).

As a result, the display apparatus 100 according to an embodiment of the present disclosure may achieve the following operational effects.

First, the display apparatus 100 according to an embodiment of the present disclosure is provided to include a plurality of support portions 132 movably coupled to the body 131, so that display apparatus 100 may be easily installed or removed from the frame.

Second, the display apparatus 100 according to an embodiment of the present disclosure is provided such that the rotating portion 134 disposed on the rear surface of the display panel 110 in a non-contact manner is rotated using the magnetic force (or magnetism) of the support mechanism 150, a plurality of display apparatuses may be easily released from the frame or may be easily installed in the frame even though the plurality of display devices are arranged with an interval therebetween.

Third, in the display apparatus 100 according to an embodiment of the present disclosure, the plurality of support portions 132 arranged on the four sides of the body 131 can be simultaneously moved in the insertion direction ID only by rotating the rotating portion 134 disposed in the center of the body 131, the display device 100 may be more easily released from or installed in the frame. Therefore, a time for replacement, repair, or installation work for the display panel 110 may be reduced.

Figure 5:
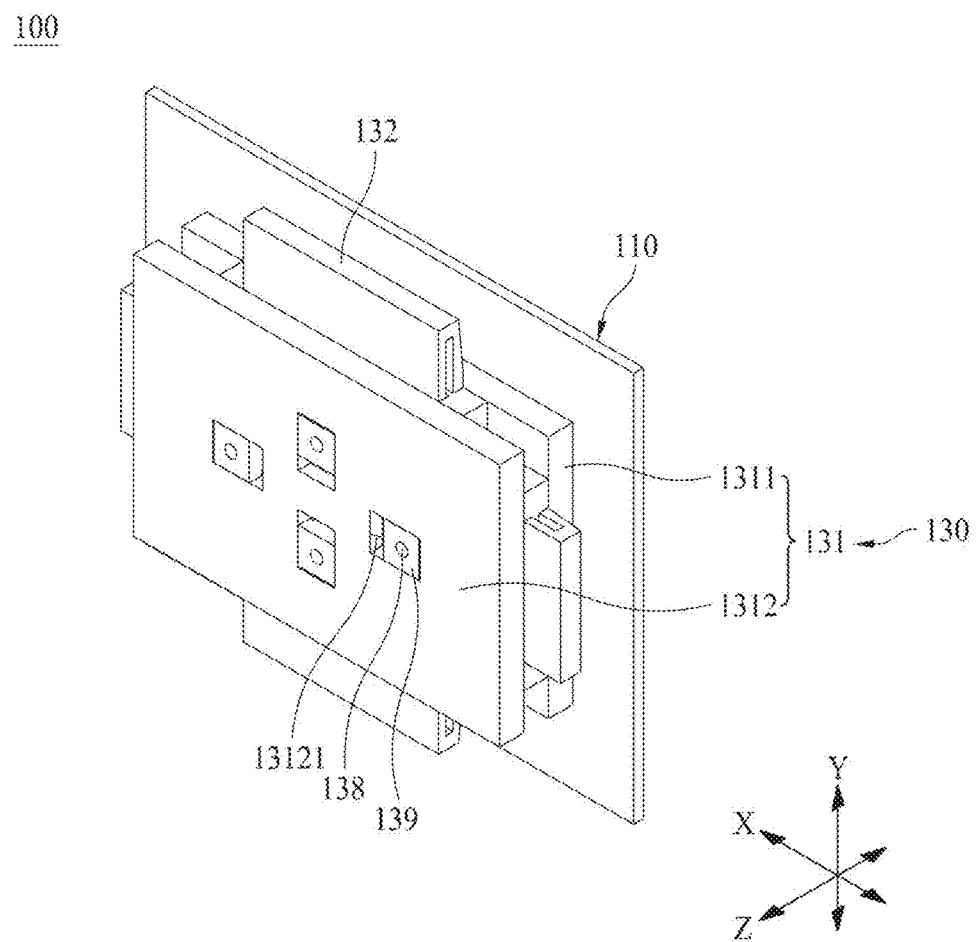
FIG. 5 is a schematic rear perspective view of a display apparatus according to a second embodiment of the present disclosure.
Figure 6:
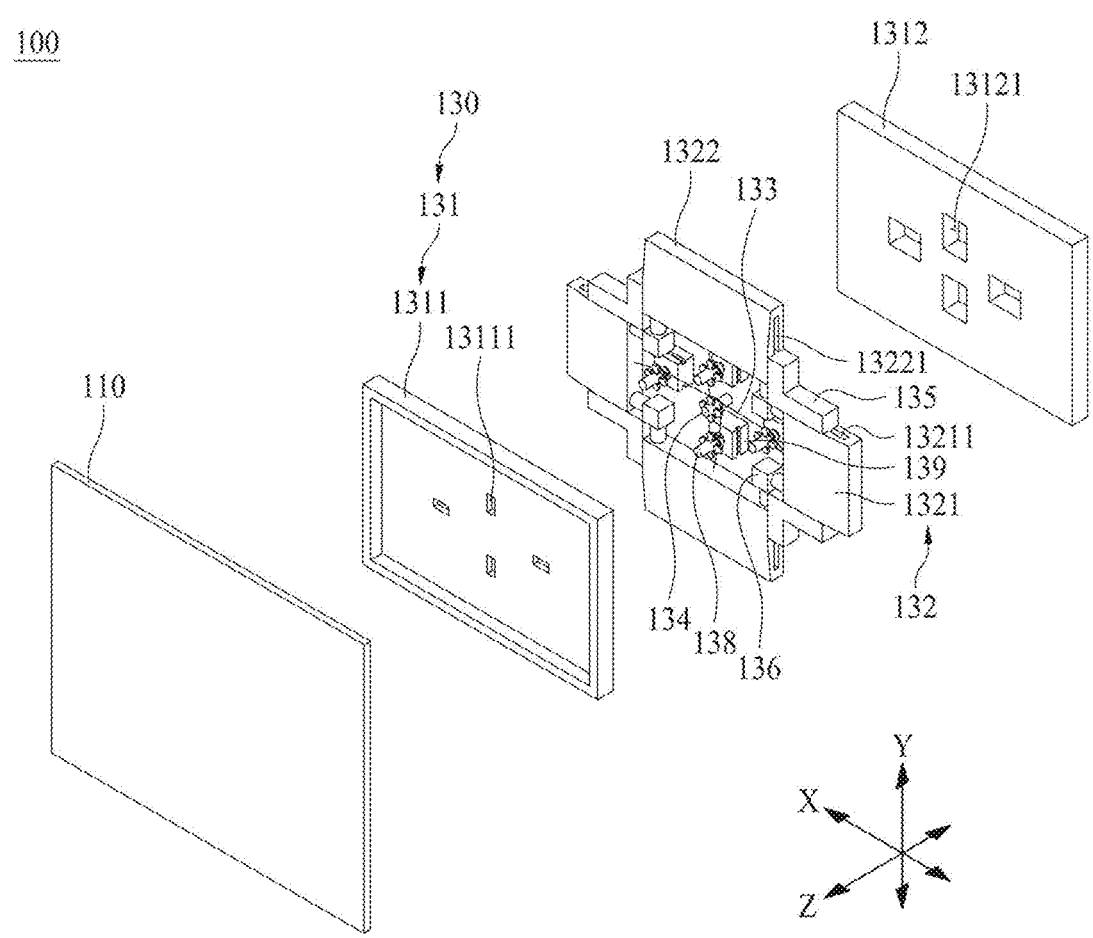
FIG. 6 is a schematic exploded perspective view of a display apparatus according to a second embodiment of the present disclosure.
Figure 7A:
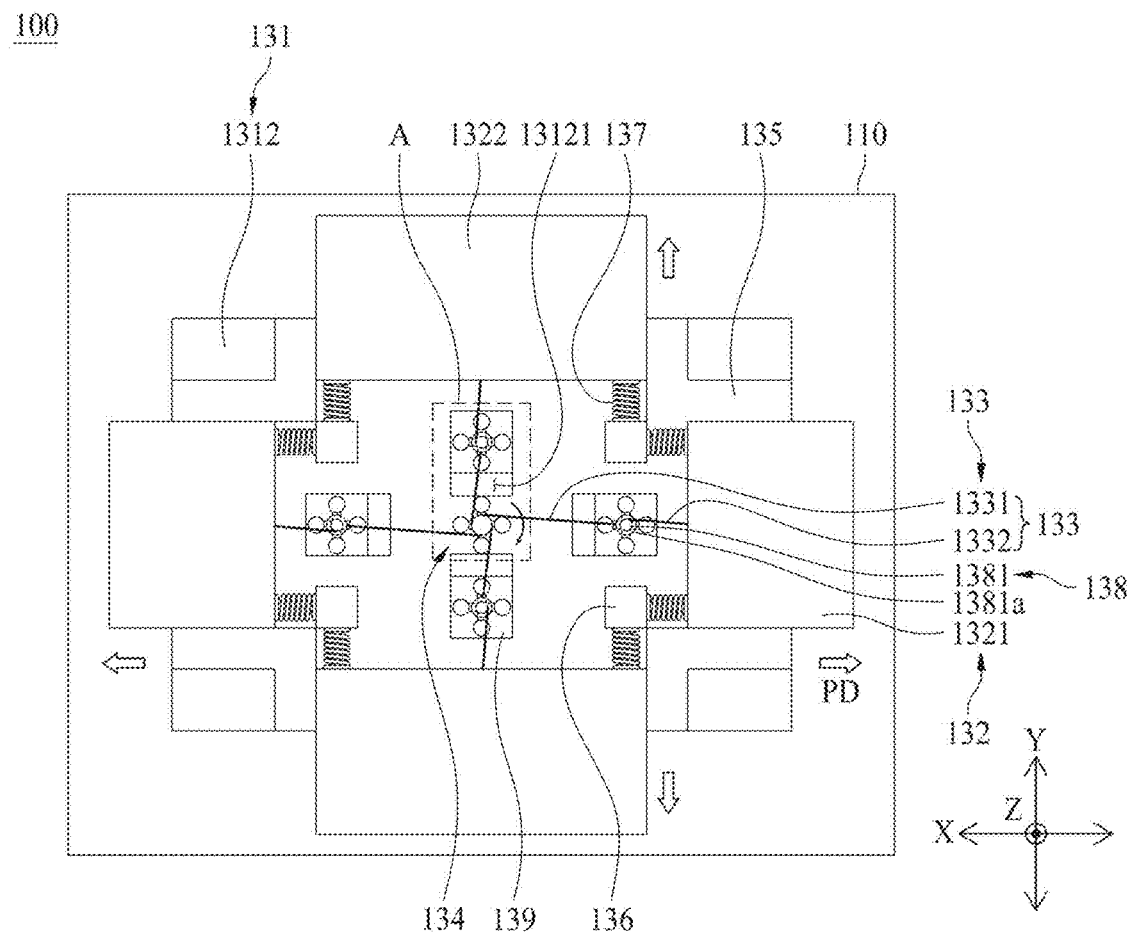
FIG. 7A is a schematic operation state view illustrating that a support portion of a display apparatus according to the second embodiment of the present disclosure protrudes.
Figure 7B:
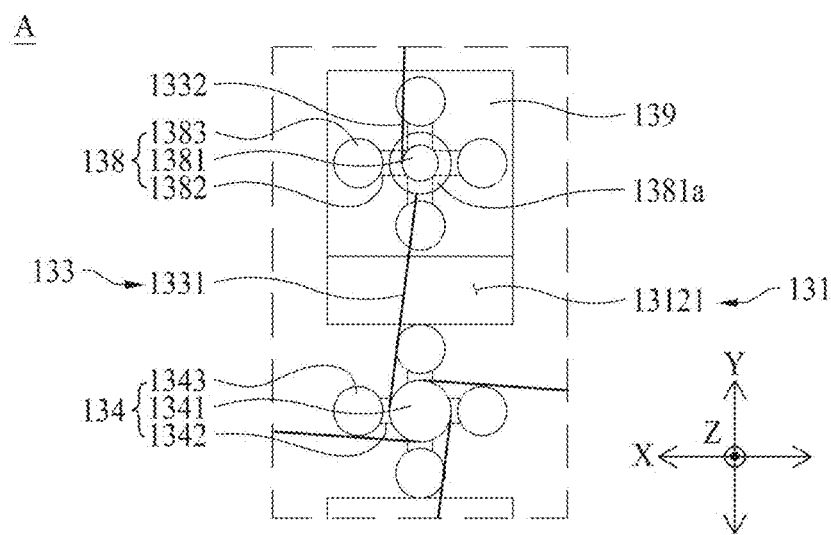
FIG. 7B is a schematic enlarged view of a portion A of FIG. 7A.
Figure 7C:
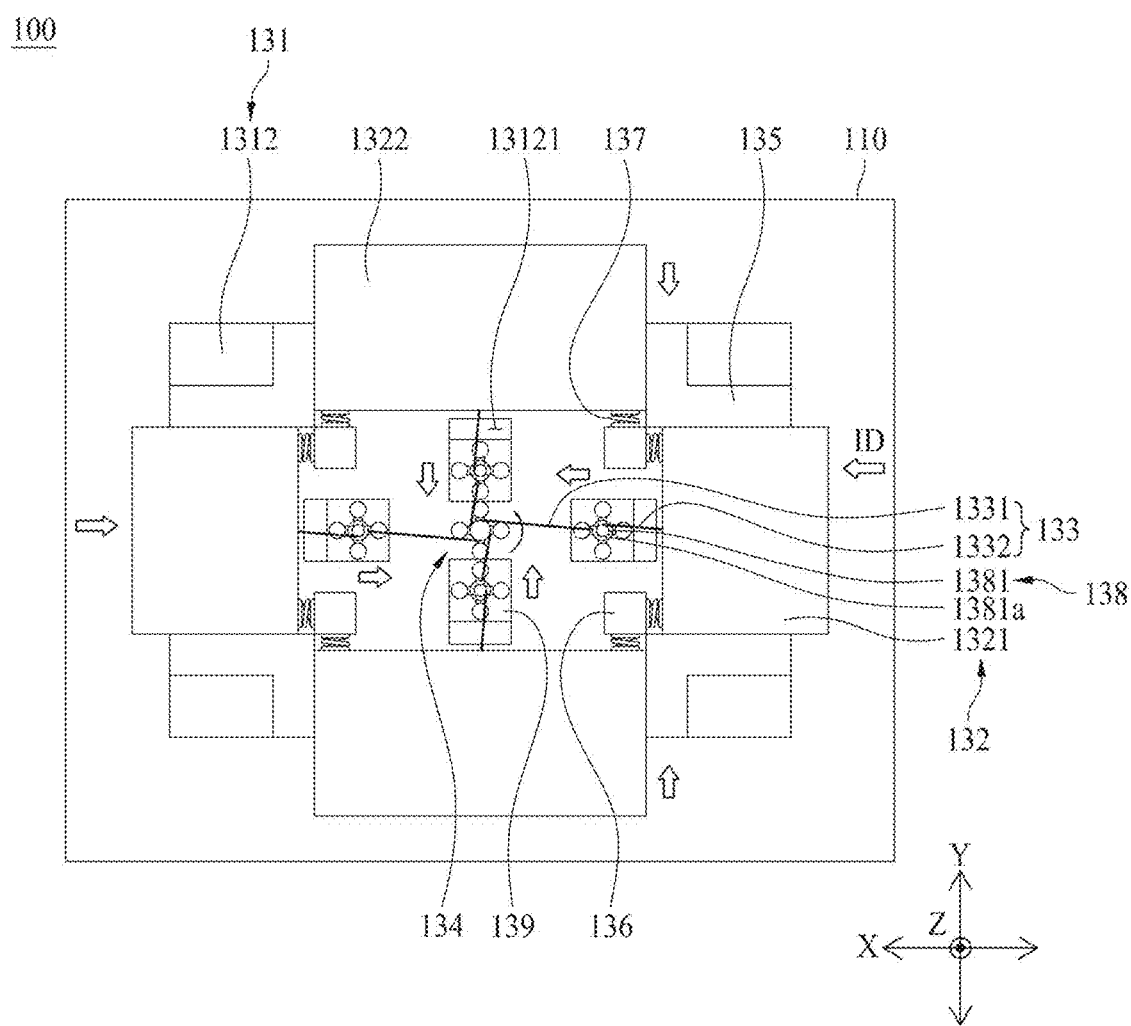
FIG. 7C is a schematic operation state view showing that a support portion of a display apparatus according to the second embodiment of the present disclosure is inserted.
Figure 8A:
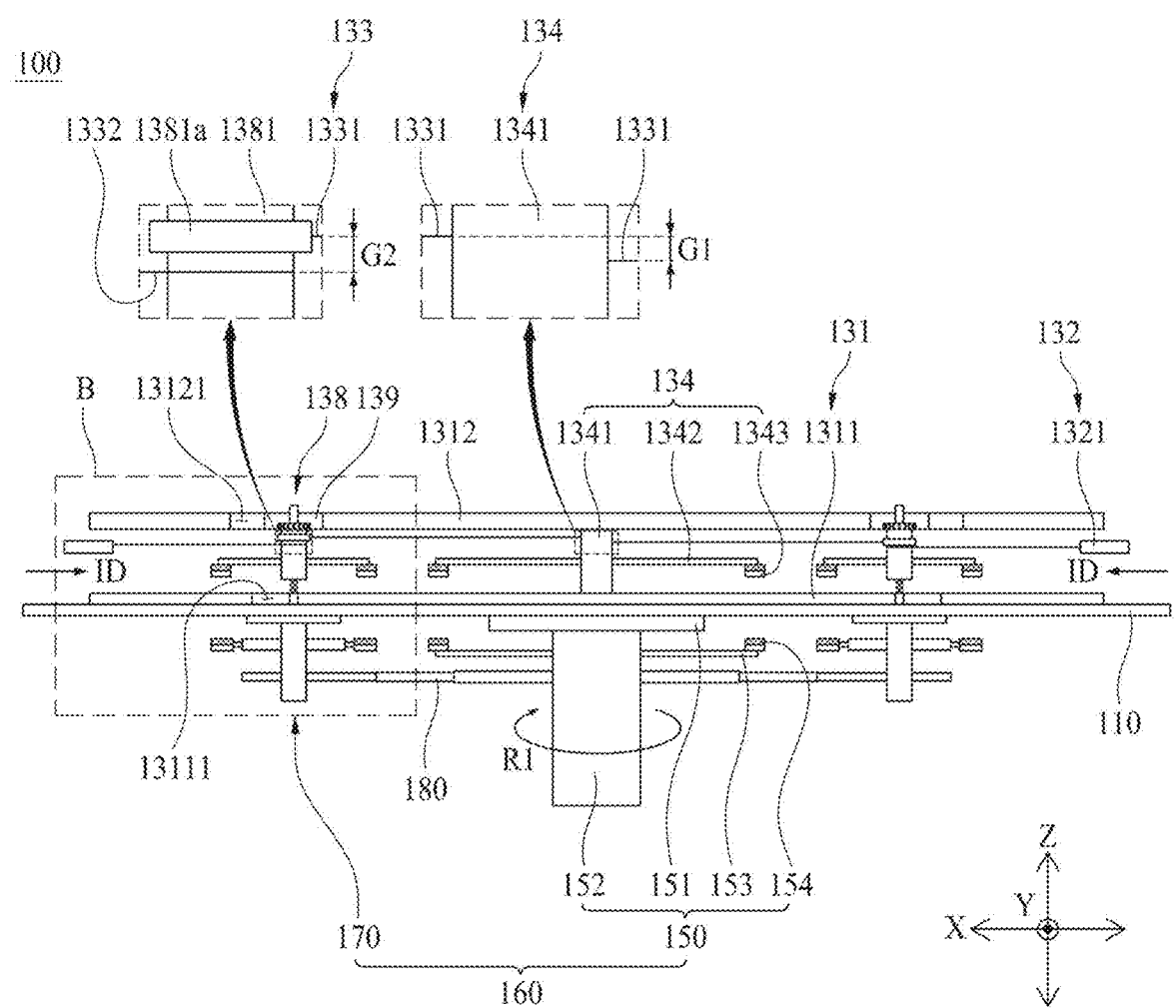
FIG. 8A is a schematic plan view of FIG. 7C illustrating an integrated support mechanism of a display apparatus according to the second embodiment of the present disclosure.
Figure 8B:
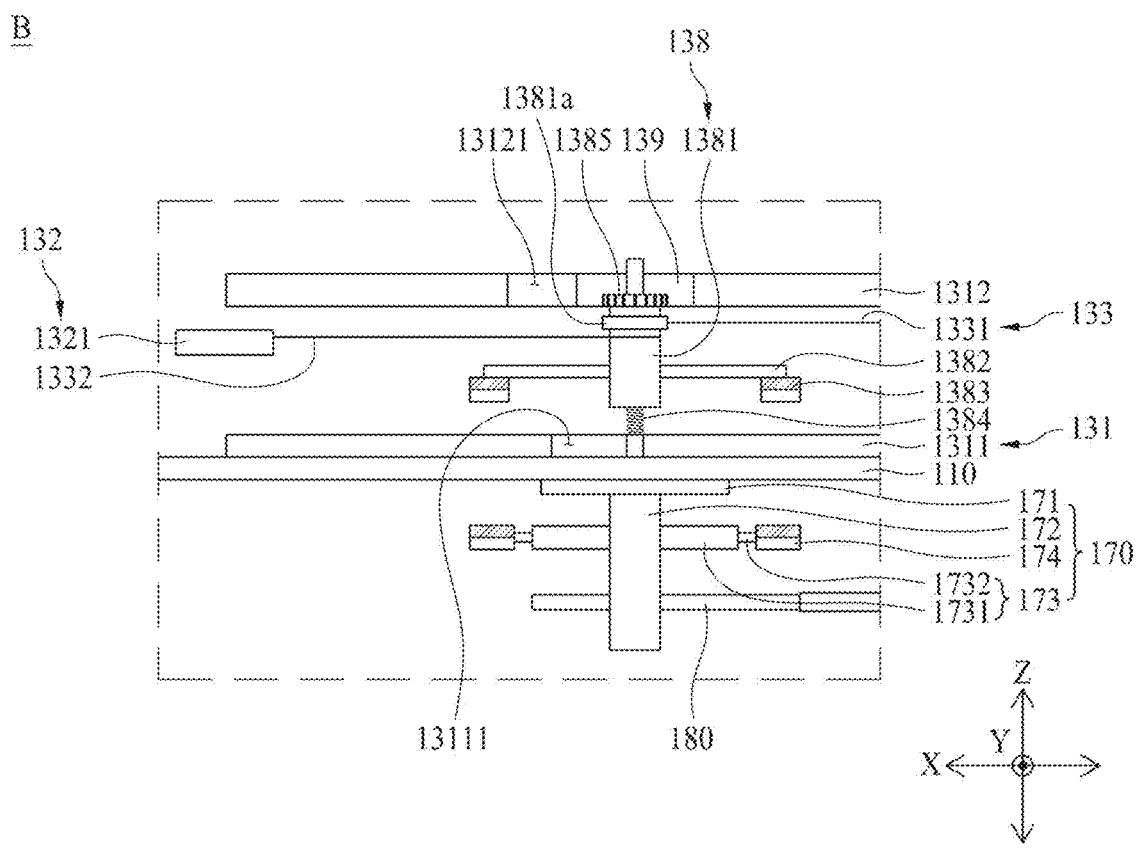
FIG. 8B is a schematic enlarged view of a portion B of FIG. 8A.
Figure 8C:
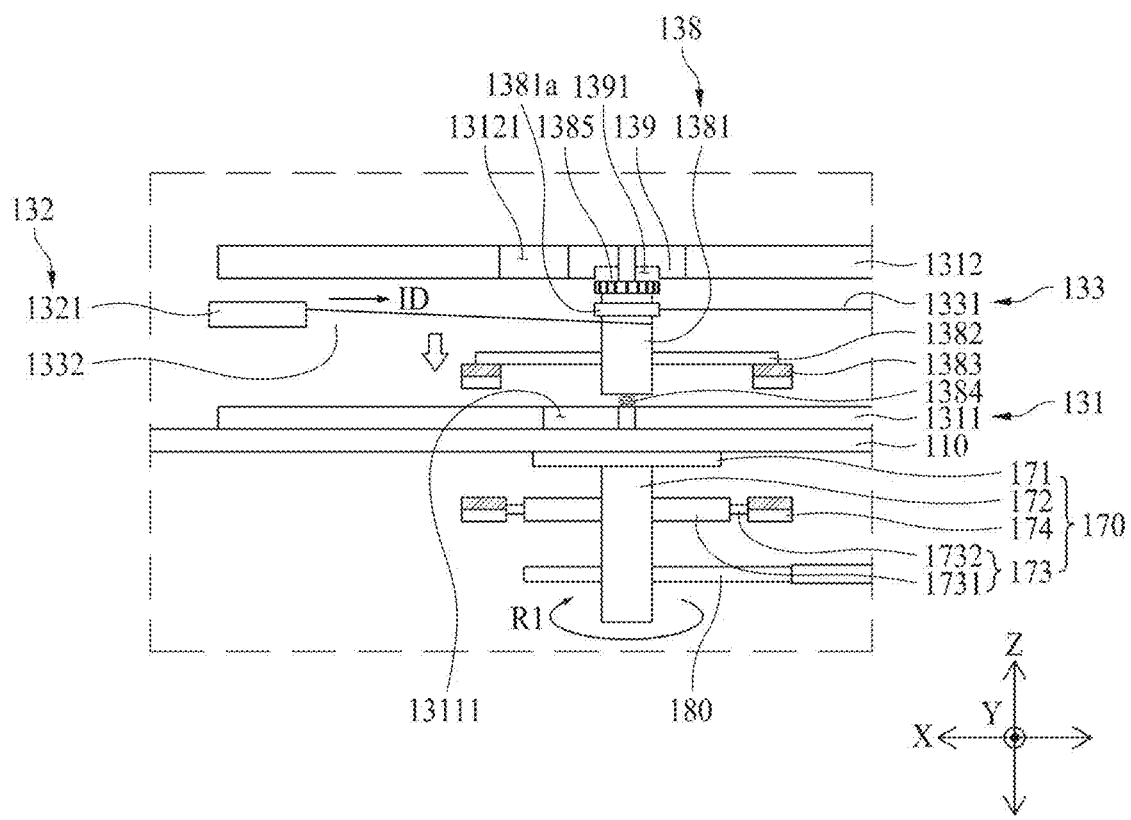
FIG. 8C is a schematic operation state view of FIG. 8B showing that a sub-support mechanism of a display apparatus according to the second embodiment of the present disclosure rotates a sub-rotating portion in a state of pulling the sub-rotating portion by attraction.
Figure 8D:
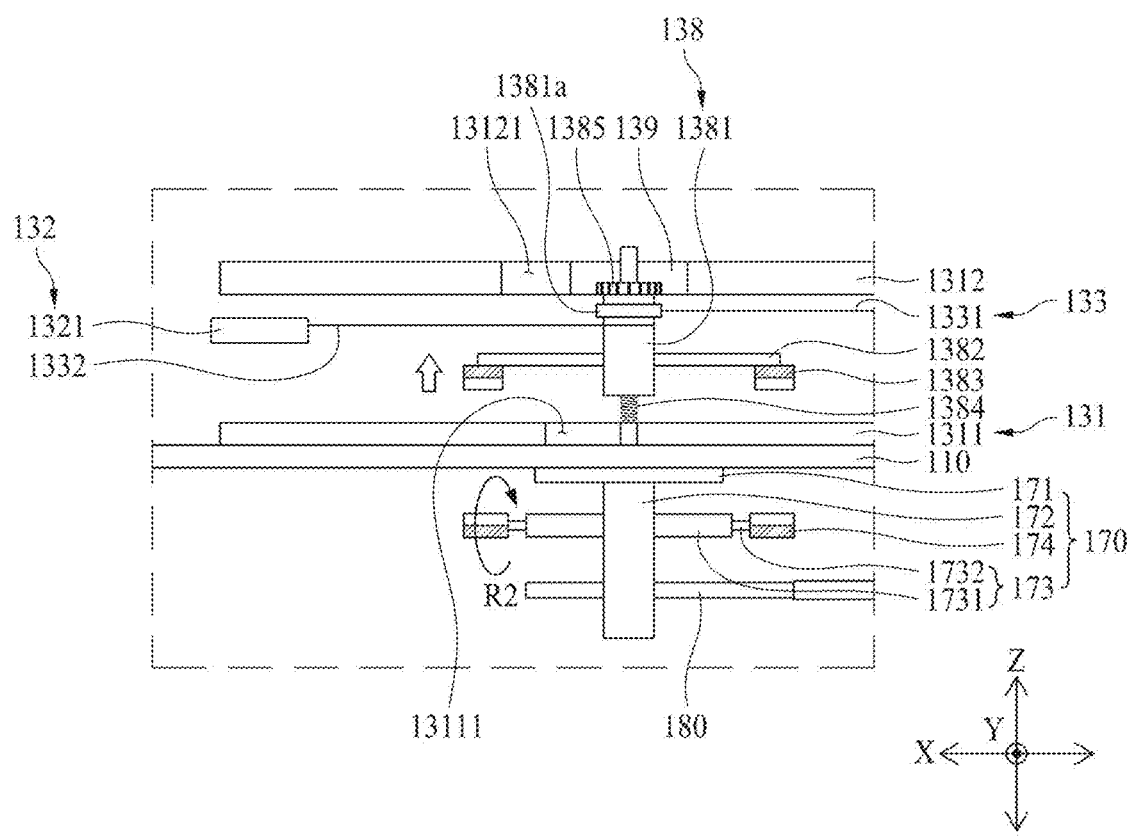
FIG. 8D is a schematic operation state view of FIG. 8B showing that a sub-support mechanism of a display apparatus according to the second embodiment of the present disclosure inserts a sub-rotating portion into a sub-fixing hole by separating the sub-rotating portion by repulsive force.

FIG. 5 is a schematic rear perspective view of a display apparatus according to a second embodiment of the present disclosure, FIG. 6 is a schematic exploded perspective view of a display apparatus according to a second embodiment of the present disclosure, FIG. 7A is a schematic operation state view illustrating that a support portion of a display apparatus according to the second embodiment of the present disclosure protrudes, FIG. 7B is a schematic enlarged view of a portion A of FIG. 7A, FIG. 7C is a schematic operation state view showing that a support portion of a display apparatus according to the second embodiment of the present disclosure is inserted, FIG. 8A is a schematic plan view of FIG. 7C illustrating an integrated support mechanism of a display apparatus according to the second embodiment of the present disclosure, FIG. 8B is a schematic enlarged view of a portion B of FIG. 8A, FIG. 8C is a schematic operation state view of FIG. 8B showing that a sub-support mechanism of a display apparatus according to the second embodiment of the present disclosure rotates a sub-rotating portion in a state of pulling the sub-rotating portion by attraction, and FIG. 8D is a schematic operation state view of FIG. 8B showing that a sub-support mechanism of a display apparatus according to the second embodiment of the present disclosure inserts a sub-rotating portion into a sub-fixing hole by separating the sub-rotating portion by repulsive force.

Referring to FIGS. 5 to 8D, the display apparatus 100 according to the second embodiment of the present disclosure is the same as the display apparatus according to FIG. 1A described above, except that the plurality of support portions 132 are individually (or independently) movably provided. Accordingly, the same reference numerals are assigned to the same components, and only different components will be described below.

In the case of the display apparatus according to FIG. 1A described above, by rotating one rotating portion 134 located in the center of the body 131, the plurality of support portions 132 are simultaneously moved in the insertion direction ID or the plurality of support portions 132 are simultaneously moved in the protrusion direction PD using the member 137. That is, the display apparatus according to FIG. 1A may be detached from the frame or installed in the frame by simultaneously moving the plurality of support portions 132.

In contrast, in the case of the display apparatus according to the second embodiment of FIG. 5, a plurality of sub-rotating portions 138 are additionally disposed between the rotating portion 134 and the plurality of support portions 132 to move the plurality of support portions 132 individually. This is to adjust a position of the display panel 110 with respect to the frame.

More specifically, the display apparatus 100 according to the second embodiment of the present disclosure may further include a plurality of sub-rotating portions 138, a plurality of sub-bodies 139, and a plurality of sub-guide holes 13121. Also, the connection portion 133 may include a plurality of first connection members 1331 and a plurality of second connection members 1332.

Each of the plurality of sub-rotating portions 138 may be disposed between the rotating portion 134 and the plurality of support portions 132 and connected to the rotating portion 134 through a first connection member 1331, and connected to each of the plurality of support portions 132 through a second connection member 1332.

More specifically, as shown in FIGS. 7B and 8A, each of the plurality of first connection members 1331 may have one side connected to the rotation surface of the rotating portion 134 (or the rotation surface of the rotating shaft 1341) and the other side connected to the sub-rotating shaft 1381 of each of the plurality of sub-rotating portions 138. Here, the sub-rotating shaft 1381 to which the other side of the first connection member 1331 is connected may include a rotating member 1381a rotatably provided separately from the sub-rotating shaft 1381. That is, the other side of the first connection member 1331 may be connected to the rotating member 1381a. Accordingly, since the rotating member 1381a does not rotate even when the sub-rotating shaft 1381 rotates, the other side of the first connection member 1331 may not be wound around the rotating member 1381a. Also, as shown in FIGS. 7A and 7B, each of the plurality of second connection members 1332 has one side connected to a rotation surface of the sub-rotating shaft 1381 of each of the plurality of sub-rotating portions 138 and the other side connected to each of the plurality of support portions 132. Accordingly, when the rotating portion 134 is rotated by an external force, the first connection member 1331 may be wound around the rotating portion 134, so that the plurality of sub-rotating portions 138 may be simultaneously moved in the insertion direction ID. In this case, the plurality of support portions 132 may also be moved in the insertion direction ID together with the plurality of sub-rotating portions 138.

In this state, when at least one sub-rotating portion 138 among the plurality of sub-rotating portions 138 is rotated by an external force, the second connection member 1332 may be wound around the rotation surface of the sub-rotating shaft 1381, so that only the support portion 132 connected to the sub-rotating portion 138 rotated by an external force may be further moved in the insertion direction ID.

As a result, in the display apparatus 100 according to the second embodiment of the present disclosure, since each of the plurality of sub-rotating portions 138 is rotated separately (or independently) from the rotating portion 134, a length by which each of the plurality of support portions 132 is inserted into the body 131 may be adjusted differently. That is, in the display apparatus 100 according to the second embodiment of the present disclosure, a position of the display panel 110 with respect to the frame may be regulated by adjusting the plurality of support portions 132 to protrude from the body 131 to have different lengths.

Each of the plurality of first connection members 1331 may be connected to the rotation surface of the rotating portion 134 (or the rotation surface of the rotating shaft 1341) at a first interval (G1, shown in FIG. 8A) to be spaced apart from each other, thereby preventing the plurality of first connection members 1331 from being tangled or interfered with each other when the rotating portion 134 is rotated. Similarly, the first connection member 1331 and the second connection member 1332 are connected to the sub-rotating shaft 1381 at a second interval (G2, shown in FIG. 8A) to be spaced apart from each other, thereby preventing the second connection member 1332 from being tangled or interfering with the first connection member 1331 when the sub-rotating shaft 1381 rotates.

The plurality of sub-rotating portions 138 may be rotatably coupled to the plurality of sub-bodies 139, respectively. Accordingly, the plurality of sub-bodies 139 may support the plurality of sub-rotating portions 138. Referring to FIGS. 5 and 7B, the plurality of sub-bodies 139 may be inserted into the sub-guide holes 13121 formed in the back plate 1312.

The plurality of sub-bodies 139 may be moved together in the insertion direction ID when the plurality of sub-rotating portions 138 are moved in the insertion direction ID according to the rotation of the rotating portion 134, and may be moved together in the protrusion direction PD when the plurality of sub-rotating portions 138 are moved in the protrusion direction PD by the elastic restoring force of the elastic member 137. That is, the plurality of sub-bodies 139 may be moved in the insertion direction ID or the protrusion direction PD according to a force acting on the plurality of sub-rotating portions 138 in a state in which the plurality of sub-bodies 139 are inserted into the sub-guide hole 13121. Each of the plurality of sub-bodies 139 may include a sub-fixing hole 1391 into which a sub-fixing member 1385 coupled to a rotation surface of a sub-rotating shaft 1381, which will be described later, is inserted.

The plurality of sub-guide holes 13121 are holes formed through the back plate 1312, and may be formed to be larger than the size of the plurality of sub-bodies 139. Here, the plurality of sub-guide holes 13121 may be formed to be larger in size in a direction toward the rotating shaft 134, respectively. That is, the plurality of sub-guide holes 13121 may be disposed to face each other with respect to the rotating portion 134. Thus, as shown in FIGS. 7A and 7C, the plurality of sub-bodies 139 may be moved in the insertion direction ID or the protrusion direction PD along the plurality of sub-guide holes 13121.

Meanwhile, each of the plurality of sub-rotating portions 138 may include a sub-rotating shaft 1381, a plurality of sub-rotating members 1382, a plurality of sub-magnetic members 1383, a sub-elastic member 1384, and a sub-fixing member 1385 in order to individually move the plurality of support portions 132.

Referring to FIGS. 8A to 8D, the sub-rotating shaft 1381 may be rotatably coupled to the sub-body 139. One side of the sub-rotating shaft 1381 may be rotatably coupled to the front plate 1311, and the other side thereof may be rotatably coupled to the sub-body 139. Accordingly, the sub-rotating shaft 1381 may be rotated while being supported by the front plate 1311 and the sub-body 139.

Meanwhile, as the plurality of sub-bodies 139 moves in the insertion direction ID or the protrusion direction PD along the plurality of sub-guide holes 13121, sub-rotating shaft guide holes 13111 (shown in FIG. 6) may be formed in the front plate 1311 to which one side of the sub-rotating shaft 1381 is coupled. The sub-rotating shaft guide holes 13111 are holes formed to penetrate through the front plate 1311. Like the sub-guide holes 13121, the sub-rotating shaft guide holes 13111 may be disposed to face each other about the rotating shaft 134 and may be formed to extend in the direction of the rotating shaft 134. Accordingly, the sub-rotating shaft 1381 may be moved in the insertion direction ID or the protrusion direction PD along the sub-rotating shaft guide hole 13111 without being inclined or bent even when it is moved by an external force.

As shown in FIG. 8B, the first connection member 1331 and the second connection member 1332 may be connected to be spaced apart from the sub-rotating shaft 1381 between the sub-rotating member 1382 and the sub-fixing member 1385.

The plurality of sub-rotating members 1382 serve to rotate the sub-rotating shaft 1381 and may be coupled to the sub-rotating shaft 1381 to rotate together with the sub-rotating shaft 1381. The plurality of sub-rotating members 1382 may be arranged in a '+' shape around the sub-rotating shaft 1381. Each of the plurality of sub-rotating members 1382 may be formed to have a shorter length than the first connection member 1331 or the second connection member 1332 and may be coupled to the sub-rotating shaft 1381. Accordingly, as shown in FIG. 8A, even if the plurality of sub-rotating portions 138 move in the insertion direction ID, they may not collide with the rotating portion 134.

The plurality of sub-magnetic members 1383 serve to form magnetic force with the sub-support mechanism 170 disposed on the front surface of the display panel 110 and may be coupled to the ends of the plurality of sub-rotating members 1382, respectively. For example, as shown in FIG. 8B, the plurality of sub-magnetic members 1383 may be coupled to an end of the rotating member 1342 so as to be positioned between the sub-rotating member 1382 and the front plate 1311. Accordingly, the plurality of sub-magnetic members 1383 may be disposed closer to the display panel 110 than the sub-rotating member 1382. This is to form a larger magnetic force with the sub-support mechanism 170 disposed on the front surface of the display panel 110 compared to a case where the sub-magnetic member is disposed on the same line as the sub-rotating member.

The sub-elastic member 1384 serves to move the sub-rotating shaft 1381 in a thickness direction, that is, in the third direction (Z-axis direction), of the display panel 110. The sub-elastic member 1384 may be disposed on one side of the sub-rotating shaft 1381. More specifically, the sub-elastic member 1384 may be disposed between the thick sub-rotating shaft 1381 and the front plate 1311, while enclosing one rotation surface of the thin sub-rotating shaft 1381. Accordingly, the sub-elastic member 1384 may be contracted as shown in FIG. 8C when the sub-magnetic member 1383 is moved toward the display panel 110 by a magnetic force with the sub-support mechanism 170, and may be stretched when the magnetic force is removed or when a repulsive force is formed between the sub-magnetic member 1383 and the sub-support magnetic member 174 as shown in FIG. 8D. When the sub-elastic member 1384 is stretched, the sub-elastic member 1384 may be supported by the front plate 1311 to move the sub-rotating shaft 1381 toward the back plate 1312. Accordingly, the sub-fixing member 1385 may be inserted into the sub-fixing hole 1391.

The sub-fixing member 1385 serves to fix the rotation surface of the sub-rotating shaft 1381 not to rotate. The sub-fixing member 1385 may be coupled to the rotation surface of the sub-rotating shaft 1381 so as to be disposed on the other side of the sub-rotating shaft 1381 as shown in FIG. 8B. The sub-fixing member 1385 may be formed in a disk shape, and may have a plurality of mountains and valleys formed on an outer surface thereof. For example, the sub-fixing member 1385 may be a male gear. When the sub-magnetic member 1383 (or the sub-rotating shaft 1381) is moved toward the display panel 110 by the magnetic force with the sub-support mechanism 170, the sub-fixing member 1385 may be spaced apart from the sub-fixing hole 1391 as shown in FIG. 8C, and when the magnetic force is removed or the repulsive force is formed, the sub-fixing member 1385 may be inserted into the sub-fixing hole 1391 as shown in FIG. 8D. The sub-fixing hole 1391 may be formed in the form of a female gear into which a male gear may be inserted. Accordingly, when the sub-fixing member 1385 is inserted into the sub-fixing hole 1391, the rotation surface of the sub-rotating shaft 1381 may not be rotated. Accordingly, in the display apparatus 100 according to the second embodiment of the present disclosure, the degree to which each of the plurality of support portions 132 protrudes from the body 131 may be controlled to be different by rotating and fixing the sub-rotating portion 138 separately (or independently) from the rotation of the rotating portion 134.

The display apparatus 100 according to the second embodiment of the present disclosure may further include a sub-support mechanism 170 to rotate the sub-rotating portion 138.

As shown in FIG. 8A, the sub-support mechanism 170 may be formed to be connected to the support rotating shaft 152 of the support mechanism 150 through the support mechanism connection portion 180. Here, the support rotating shaft 152 of the support mechanism 150 may be rotatably coupled to the support mechanism connection portion 180. Accordingly, even when the support rotating shaft 152 rotates, the support mechanism connection portion 180 may not be rotated and only the support rotating member 153 may be rotated.

In the present disclosure, a mechanism for rotating the rotating portion 134 and the sub-rotating portion 138 disposed on the rear side of the display panel 110 in a non-contact manner from the front of the display panel 110 is defined as an integrated support mechanism 160. Accordingly, as shown in FIG. 8A, the integrated support mechanism 160 may include a support mechanism 150, a sub-support mechanism 170, and a support mechanism connection portion 180.

Meanwhile, the sub-support mechanism 170 may be coupled to edge portions of both sides of the support mechanism connection portion 180 with reference to FIG. 8A. When the support rotating shaft 152 is rotated in the first rotation direction (arrow direction R1), the sub-rotating portions 138 disposed on both sides of the rotating portion 134 may be moved in the insertion direction ID. This is because the first connection member 1331 is wound around the rotating portion 134. Accordingly, the support mechanism connection portion 180 may be provided in a telescopic manner so that the sub-support mechanism 170 is positioned at a position corresponding to the sub-rotating portion 138. As the support mechanism connection portion 180 is provided in a telescopic manner, a length of the support mechanism connection portion 180 may be adjusted, and accordingly, a distance between the support rotating shaft 152 and the sub-support mechanism 170 may be adjusted according to the position of the sub-rotating portion 138. Therefore, since the sub-support mechanism 170 may rotate the sub-rotating portion 138 at a position corresponding to the sub-rotating portion 138, each of the plurality of support portions 132 may be moved separately (or independently) further in the insertion direction ID.

The sub-support mechanism 170 is attached to the front surface of the display panel 110 at a position spaced apart from the support mechanism 150 and is coupled to the sub-rotating portion 138 using magnetic force in a non-contact manner, and may be rotated in the in the first rotation direction (arrow direction R1) by an external force as shown in FIG. 8C, thereby rotating the sub-rotating portion 138 disposed on the rear surface of the display panel 110. The sub-support mechanism 170 may include a sub-compression member 171, a sub-support rotating shaft 172, a sub-support rotating member 173, and a sub-support magnetic member 174.

The sub-compression member 171 may be compressed against the front surface of the display panel 110. As the sub-compression member 171 is compressed against the display panel 110, even if the display panel 110 is detached (or spaced apart) from the frame, the sub-compression member 171 may be supported by the sub-support mechanism 170 and may not fall. The sub-compression member 171 may be formed of a rubber material to improve a compression force, but is not limited thereto.

The sub-support rotating shaft 172 may be rotatably coupled to the sub-compression member 171. The sub-support rotating shaft 172 may be arranged in line with the rotating shaft 1381 of the sub-rotating portion 138 so that each of the plurality of sub-support magnetic members 174 may be arranged in a position corresponding to each of the plurality of sub-magnetic members 1383 of the sub-rotating portion 138.

The plurality of sub-support rotating members 173 may be coupled to the sub-support rotating shaft 172 to rotate together with the sub-support rotating shaft 172. For example, the plurality of sub-support rotating members 173 may be arranged in a '+' shape around the sub-support rotating shaft 172. Each of the plurality of sub-support rotating members 173 may be formed to have the same length as the plurality of sub-rotating members 1382 and coupled to the sub-support rotating shaft 172.

The plurality of sub-support magnetic members 174 serve to form a magnetic force with the plurality of sub-magnetic members 1383 disposed on the rear side of the display panel 110 and may be coupled to the ends of the plurality of sub-support rotating members 173, respectively. As shown in FIG. 8C, since the plurality of sub-magnetic members 174 are disposed to correspond to the plurality of sub-magnetic members 1383, respectively, the plurality of sub-magnetic members 174 and the plurality of sub-magnetic members 1383 may be disposed to face each other to form an attractive force therebetween.

Meanwhile, as shown in FIG. 8B, the plurality of sub-support magnetic members 174 may be coupled to the ends of the plurality of sub-support rotating members 173 so as to be disposed on the same line as the sub-support rotating members 173. This is different from the support mechanism 150. The support mechanism 150 only needs to rotate the rotating portion 134, but the sub-support mechanism 170 separates the sub-rotating portion 138 from the sub-fixing hole 1391, rotates the sub-rotating portion 138, and then inserts the sub-rotating portion 138 into the sub-fixing hole 1391. In order to insert the sub-rotating portion 138 (or the sub-fixing member 1385) into the sub-fixing hole 1391, the plurality of sub-support rotating members 173 include a first support frame 1731 and a second support frame 1732.

The first support frame 1731 may be coupled to the sub-support rotating shaft 172 to rotate together with the sub-support rotating shaft 172. Accordingly, when the sub-support rotating shaft 172 is rotated, the first support frame 1731 may also be rotated. The first support frame 1731 may be supported by the sub-support rotating shaft 172 to support the second support frame 1732.

The second support frame 1732 may be rotatably coupled to the first support frame 1731. As shown in FIG. 8D, the second support frame 1732 may be rotated in the second rotation direction (R2 arrow direction). The second rotation direction (R2 arrow direction) may be a direction perpendicular to the first rotation direction (arrow direction R1) of the sub-support rotating shaft 172. Since the plurality of sub-support magnetic members 174 are coupled to the end of the second support frame 1732, the plurality of sub-support magnetic members 174 may be rotated together as the second support frame 1732 is rotated.

As shown in FIG. 8C, when the position of the support portion 132 (or the position protruding from the body 131) is determined by rotating the sub-rotating portion 138 using the sub-support mechanism 170, as shown in FIG. 8D, the plurality of sub-magnetic members 174 may be rotated in the second rotation direction (R2 arrow direction) by the user to face the plurality of sub-magnetic members 1383 so that the same polarities face each other. Accordingly, since the plurality of sub-support magnetic members 174 and the plurality of sub-magnetic members 1383 form a repulsive force therebetween, the sub-rotating portion 138 may move toward the back plate 1312 in a state of being stopped from rotation. In this case, since the sub-fixing member 1385 is inserted into the sub-fixing hole 1391, the sub-rotating portion 138 is not rotated any further and is fixed.

In the above, it has been described that the plurality of support portions 132 are moved in the insertion direction ID, but when the support mechanism 150 (or the integrated support mechanism 160) is spaced apart from the front surface of the display panel 110, the magnetic force with the rotating portion 134 (and the sub-rotating portion 138) disappears, and thus, the plurality of support portions 132 may be moved in the protrusion direction PD by the elastic member 137 supported by the support frame 136. However, in the display apparatus 100 according to the second embodiment of the present disclosure, since the sub-fixing member 1385 coupled to each of the plurality of sub-rotating portions 138 is inserted into the sub-fixing hole 1391 formed in the sub-body 139, the plurality of support portions 132 may no longer be moved in the protrusion direction PD and may be fixed in positions.

As a result, in the display apparatus 100 according to the second embodiment of the present disclosure, since the plurality of support portions 132 may be simultaneously moved in the insertion direction ID using the support mechanism 150 of the integrated support mechanism 160, a time for attachment and detachment with respect to the frame may be reduced, and since the protrusion position of each of the plurality of support portions 132 may be adjusted using the sub-support mechanism 170, the position of the display panel 110 for the frame may be easily adjusted without a separate position adjustment mechanism.

Meanwhile, although the display apparatus 100 according to the second embodiment of the present disclosure has been described as including both the rotating portion 134 and the sub-rotating portion 138, the present disclosure is not limited thereto and the display apparatus 100 may include only the plurality of sub-rotating portions 138 without the rotating portion 134. In this case, the integrated support mechanism 160 may be provided to include only the plurality of sub-support mechanisms 170 without the support mechanism 150. Accordingly, since the plurality of support portions 132 may be individually moved in the insertion direction ID by the plurality of sub-support mechanisms 170, the plurality of support portions 132 may be positioned at different protruding positions or the same protruding positions.

Figure 9A:
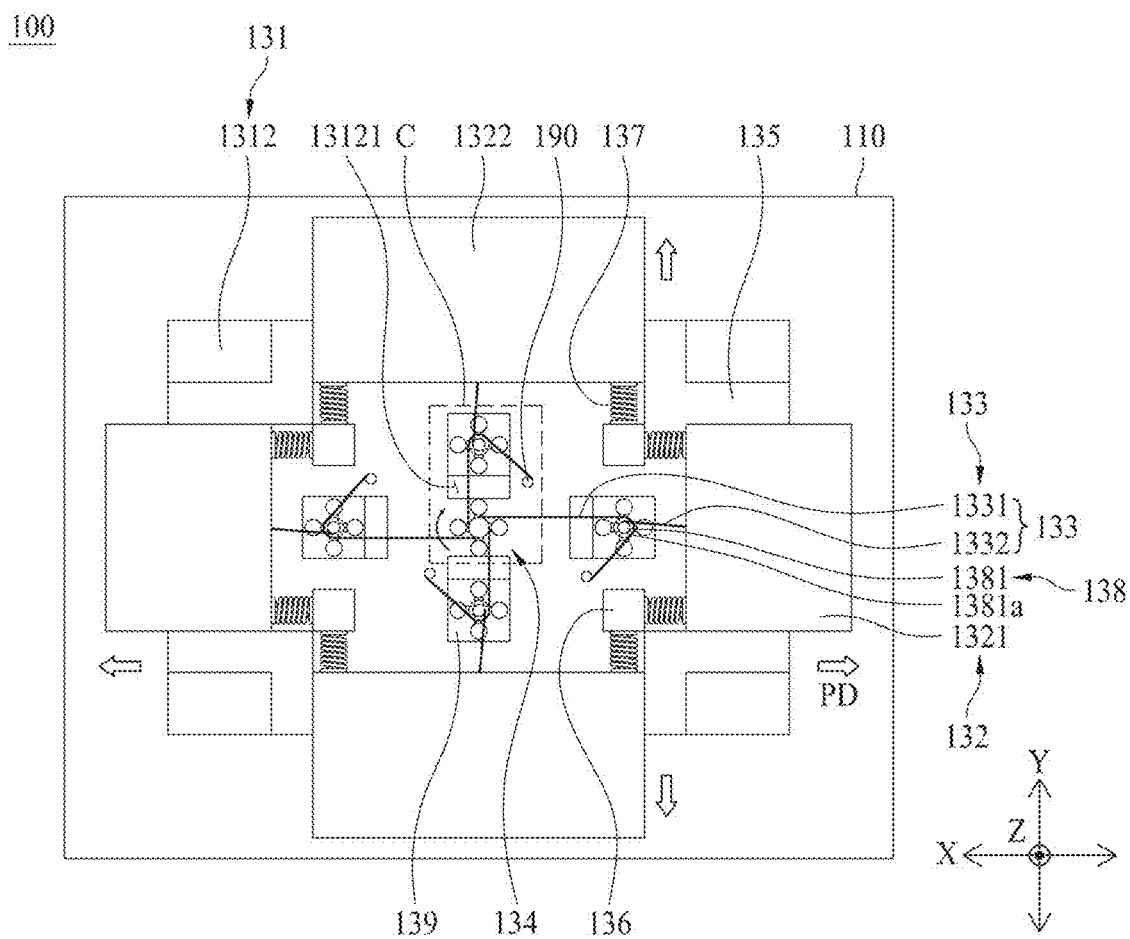
FIG. 9A is a schematic operation state view illustrating that a support portion of a display apparatus according to a third embodiment of the present disclosure protrudes.
Figure 9B:
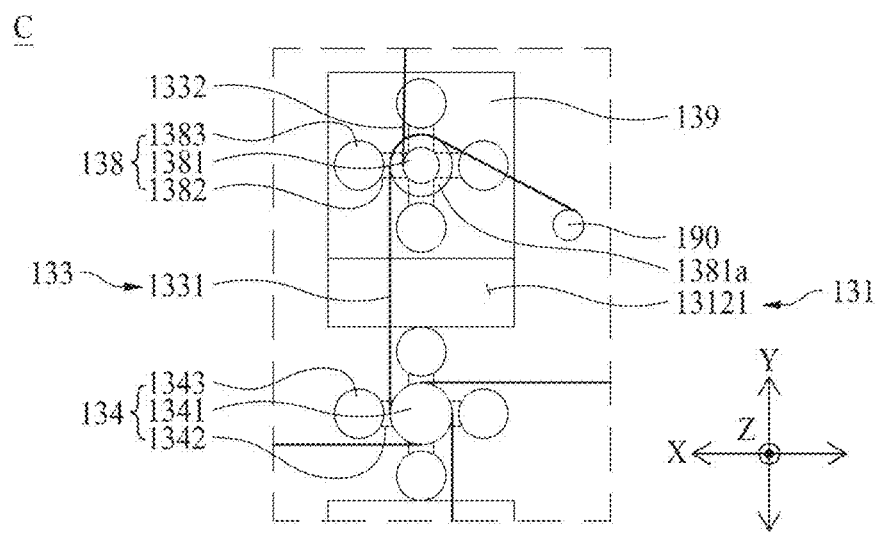
FIG. 9B is a schematic enlarged view of a portion C of FIG. 9A.
Figure 9C:
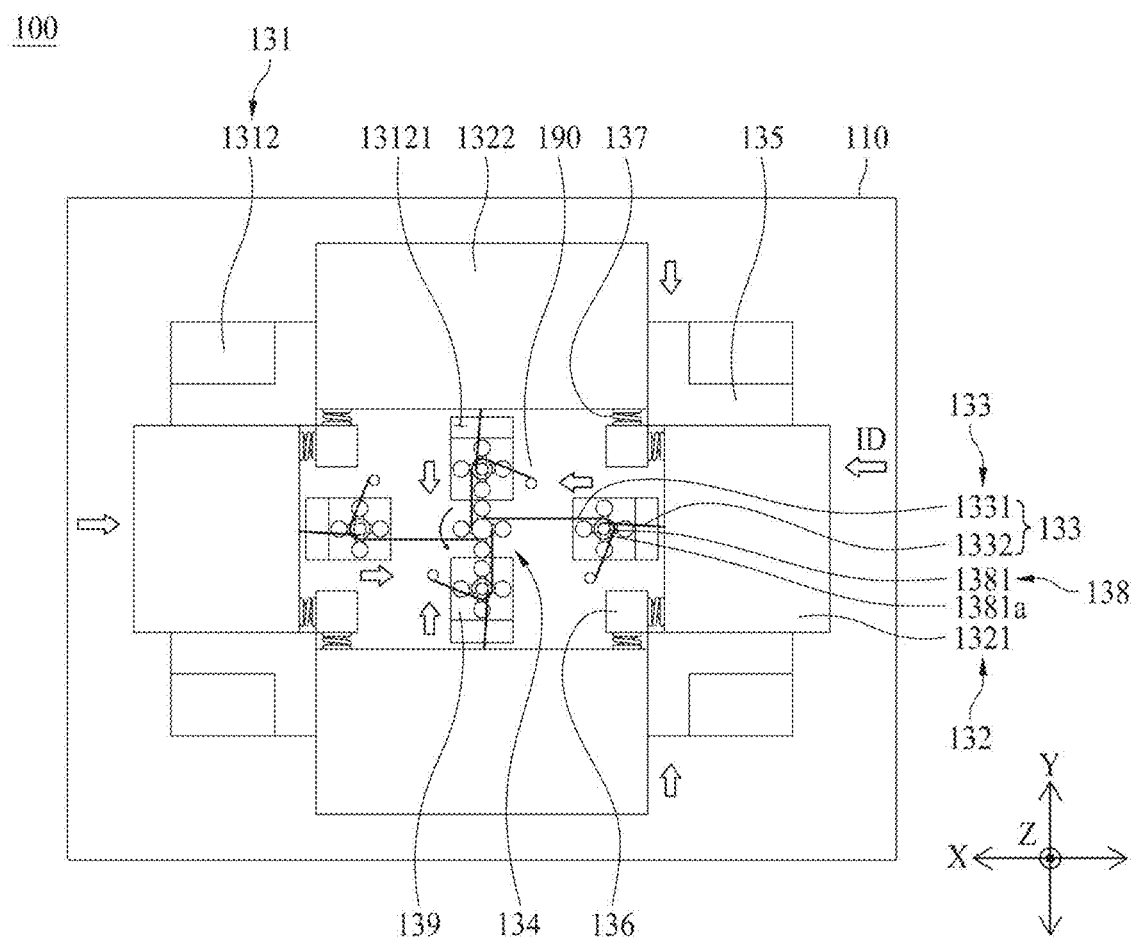
FIG. 9C is a schematic operation state view showing that a support portion of a display apparatus according to the third embodiment of the present disclosure is inserted.

FIG. 9A is a schematic operation state view illustrating that a support portion of a display apparatus according to a third embodiment of the present disclosure protrudes, FIG. 9B is a schematic enlarged view of a portion C of FIG. 9A, and FIG. 9C is a schematic operation state view showing that a support portion of a display apparatus according to the third embodiment of the present disclosure is inserted.

Referring to FIGS. 9A to 9C, the display apparatus 100 according to the third embodiment of the present disclosure is the same as the display apparatus according to FIG. 7A described above, except that the display apparatus 100 according to the third embodiment of the present disclosure further includes a plurality of fixing portions 190 disposed on the back plate 1312 not to overlap with a imaginary line connecting the rotating portion 134 and the plurality of sub-rotating portions 138, one side of each of the plurality of first connection members 1331 is connected to the rotation surface of the rotating portion 134 and the other side thereof is connected to the plurality of fixing portions 190, and each of the plurality of sub-rotating portions 138 is in contact with the plurality of first connection members 1331 between one side and the other side of each of the plurality of first connection members 1331. Accordingly, the same reference numerals are given to the same components, and only different components will be described below.

In the case of the display apparatus according to FIG. 7A described above, one side of each of the plurality of first connection members 1331 is connected to the rotation surface of the rotating portion 134, and the other side of each of the plurality of sub-rotating portions 138 is directly connected to the rotating member 1381a provided in the sub-rotating shaft 1381. Therefore, in the case of the display apparatus according to FIG. 7A, when the rotating portion 134 is rotated by the support mechanism 150, the rotating portion 134 may directly move the sub-rotating shaft 1381 of each of the plurality of sub-rotating portions 138 in the insertion direction ID.

In contrast, in the case of the display apparatus according to the third embodiment of FIG. 9A, the sub-rotating shaft 1381 of each of the plurality of sub-rotating portions 138 is indirectly connected to the first connection member 1331 between one side and the other side of each of the first connection members 1331. Accordingly, in the case of the display apparatus according to the third embodiment of FIG. 9A, when the rotating portion 134 is rotated by the support mechanism 150 as shown in FIG. 9C, the sub-rotating shaft 1381 may be indirectly moved in the insertion direction ID by tension generated in the first connection member 1331. Accordingly, in the case of the display apparatus according to the third embodiment of FIG. 9A, the sub-rotating shaft 1381 with which the first connection member 1331 is in contact may have a function like a pulley. Therefore, in the display apparatus 100 according to the third embodiment of the present disclosure, the first connection member 1331 and the second connection member 1332 may be prevented from being tangled or interfered with each other even when the rotation surface of the sub-rotating shaft 1381 rotates. Meanwhile, since the second connection member 1332 is coupled to the rotation surface of the sub-rotating shaft 1381, when the rotation surface of the sub-rotating shaft 1381 is rotated, the second connection member 1332 may be wound around the rotation surface of the sub-rotating shaft 1381.

Figure 10:
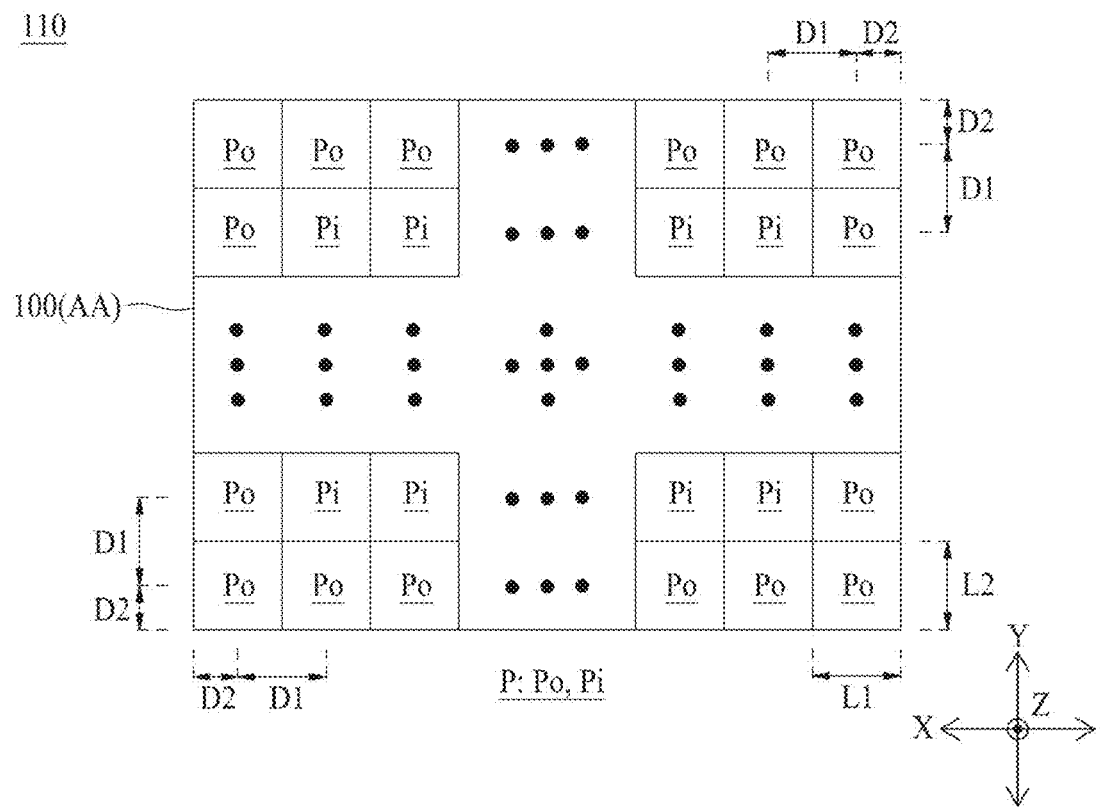
FIG. 10 is a schematic front view of a display apparatus according to an embodiment of the present disclosure.
Figure 11:
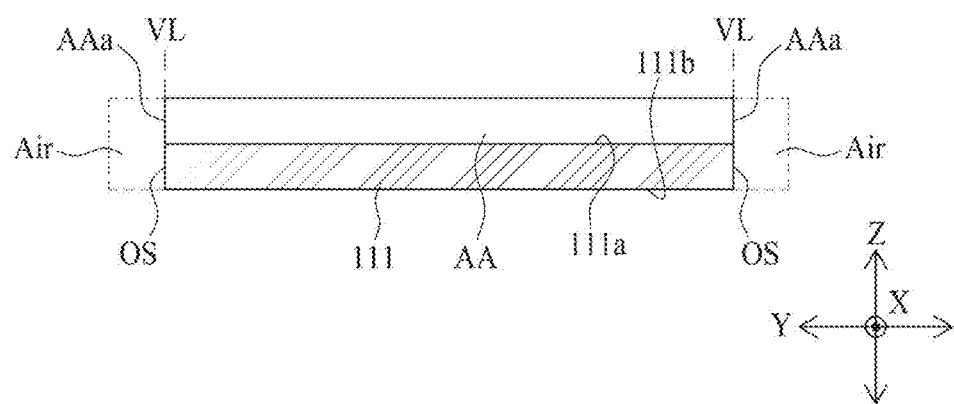
FIG. 11 is a schematic side view of a display apparatus according to an embodiment of the present disclosure.
Figure 12A:
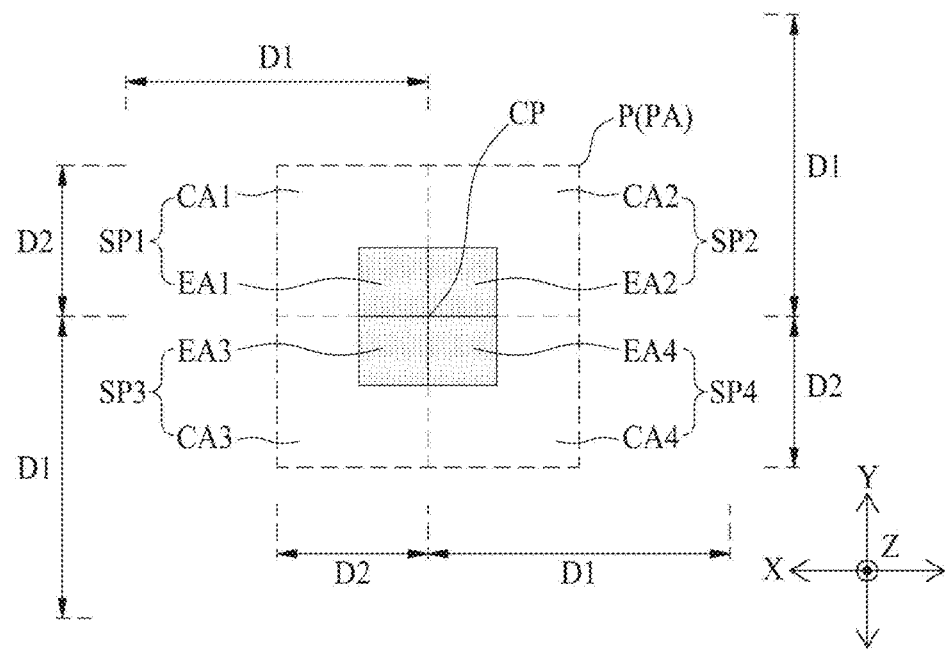
FIG. 12A is a view illustrating one pixel according to an example illustrated in FIG. 10.
Figure 12B:
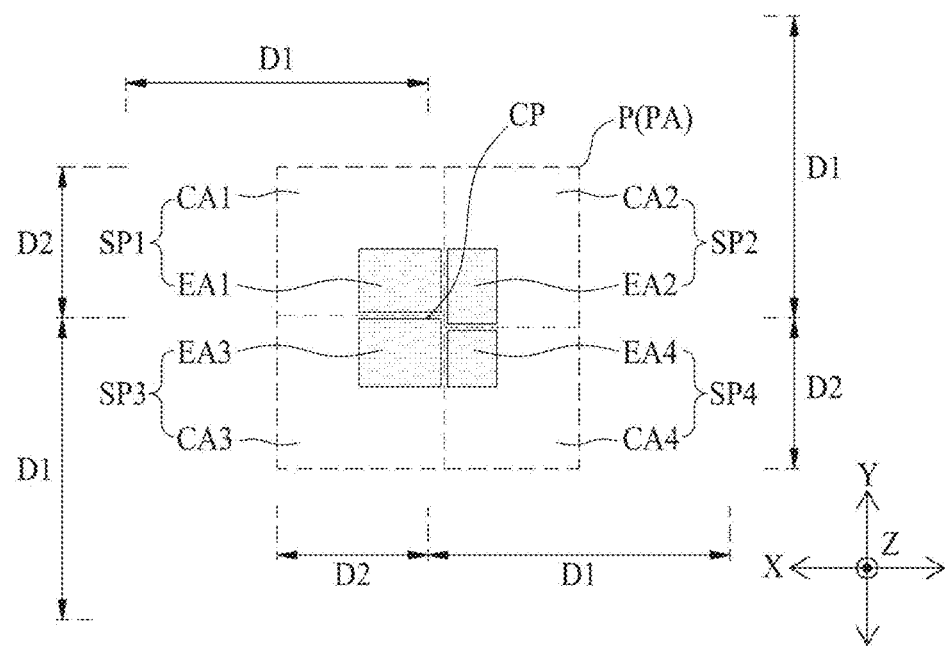
FIG. 12B is a view illustrating one pixel according to another example illustrated in FIG. 10.

FIG. 10 is a schematic front view of a display apparatus according to an embodiment of the present disclosure, FIG. 11 is a schematic side view of a display apparatus according to an embodiment of the present disclosure, FIG. 12A is a view illustrating one pixel according to an example illustrated in FIG. 10, FIG. 12B is a view illustrating one pixel according to another example illustrated in FIG. 10

Referring to FIGS. 10 and 11, in the display apparatus 100 according to an embodiment of the present disclosure, the display panel 110 may include a substrate 111 having a display portion AA, a substrate 111, and a plurality of pixels P formed on the display portion AA of the substrate 111.

The substrate 111 may be expressed as a first substrate, a base substrate, or a pixel array substrate. For example, the substrate 111 may be a glass substrate, a bendable thin glass substrate, or a plastic substrate.

The substrate 111 according to an example may include a first surface 111a, a second surface 111b, and an outer surface OS. The first surface 111a of the substrate 111 may be defined as a front surface, an upper surface, or an upper side surface facing the front of the display apparatus. The second surface 111b of the substrate 111 may be defined as a back surface, a rear surface, a lower surface, or a lower side surface facing the rear of the display apparatus. The outer surface OS of the substrate 111 may be defined as a side, a side surface, or a side wall exposed to the air while facing a lateral surface of the display apparatus.

The display portion AA may be expressed an area where an image is displayed and may be expressed as an active portion, an active region, or a display region. A size of the display portion AA may be the same as the size of the substrate (or display apparatus) 111. For example, the size of the display portion AA may be the same as the overall size of the first surface 111a of the substrate 111. Accordingly, the display portion AA is implemented (or disposed) on the entire front surface of the substrate 111 so that the substrate 111 does not include a non-display region is provided along the edge of the first surface 111a to surround the entire display portion AA. Accordingly, the entire front surface of the display apparatus may implement the display portion AA.

The end (or outermost) AAa of the display portion AA may overlap an outer surface OS of the substrate 111 or may be aligned with the outer surface OS of the substrate 111. For example, based on the thickness direction (third direction (Z-axis direction)) of the display apparatus, the lateral surface AAa of the display portion AA may be aligned with an extended vertical extension line VL perpendicular to the outer surface OS of the substrate 111. The lateral surface AAa of the display portion AA may be surrounded only by air without being surrounded by a separate mechanism. That is, all of the lateral surfaces AAa of the display portion AA may have a structure in direct contact with air without being surrounded by a separate mechanism. Accordingly, since the outer surface OS of the substrate 111 corresponding to the end AAa of the display portion AA is surrounded only by air, the display apparatus 100 according to the embodiment of the present disclosure may have an air-bezel structure in which the end AAa of the display portion AA is surrounded by air instead of an opaque non-display region or a structure without a bezel.

The plurality of pixels P may be arranged (or disposed) to have a first interval D1 on the display portion AA of the substrate 111 in each of the first direction (X-axis direction) and the second direction (Y-axis direction). The first direction (X-axis direction) may be a horizontal direction, or a first longitudinal direction (e.g., a horizontal longitudinal direction) of the substrate 111 or the display apparatus. The second direction (Y-axis direction) may be a vertical direction or may be a second longitudinal direction (e.g., a vertical longitudinal direction) of the substrate 111 or the display apparatus.

Each of the plurality of pixels P may be implemented on a plurality of pixel regions defined on the display portion AA of the substrate 111. Each of the plurality of pixel regions may have a first length L1 parallel to the first direction (X-axis direction) and a second length L2 parallel to the second direction (Y-axis direction). The first length L1 may be equal to the second length L2 or may be equal to the first interval D1. Each of the first length L1 and the second length L2 may be equal to the first interval D1. Accordingly, the plurality of pixels P may all have the same size. For example, the first length L1 may be expressed as a first width, a horizontal length, or a horizontal width. The second length L2 may be expressed as a second width, a vertical length, or a vertical width.

Two pixels P adjacent in each of the first direction (X-axis direction) and the second direction (Y-axis direction) may have the same first interval D1 within an error range in the manufacturing process. The first interval D1 may be a pitch (or pixel pitch) between two adjacent pixels P. For example, the first distance D1 may be the shortest distance (or the shortest length) between the centers of each of the two adjacent pixels P. Optionally, the pixel pitch may be a size between one end and the other end of the pixel P parallel to the first direction (X-axis direction). Also, in another example, the pixel pitch may be expressed as a size between one end and the other end of the pixel P parallel to the second direction (Y-axis direction).

Each of the plurality of pixels P may include a circuit layer including a pixel circuit implemented in a pixel region on the substrate 111 and a light emitting device layer disposed on the circuit layer and connected to the pixel circuit. The pixel circuit outputs a data current corresponding to a data signal in response to a data signal and a scan signal supplied from pixel driving lines disposed in the pixel region. The light emitting device layer may include a light emitting layer that emits light by the data current supplied from the pixel circuit.

The plurality of pixels P may be divided into outermost pixels Po and internal pixels Pi.

The outermost pixels Po (or the first pixels) may be pixels disposed closest to the outer surface OS of the substrate 111 among the plurality of pixels P. For example, the outermost pixels Po may be expressed as first pixels.

The second distance D2 between the center of the outermost pixels Po and the outer surface OS of the substrate 111 may be half or less than half the first distance D1. For example, the second distance D2 may be the shortest distance (or the shortest length) between the center of the outermost pixels Po and the outer surface OS of the substrate 111.

When the second interval D2 exceeds half of the first interval D1, the substrate 111 have a larger size than the display portion AA by a difference between the half of the first interval D1 and the second interval D2, and therefore, the region between the end of the outermost pixel Po and the outer surface OS of the substrate 111 may be configured as a non-display region surrounding the entire display portion AA. For example, when the second interval D2 exceeds half of the first interval D1, the substrate 111 inevitably includes a bezel region according to the non-display region surrounding the entire display region AA. Therefore, when the plurality of display panels 110 are disposed adjacent to each other, the sum of the second intervals D2 of each of the two substrates 111 is greater than the first interval D1, so that the sum of the second interval D2 of each of the two substrates 111 is greater than the sum (or seam) of the bezel region of each substrate 111 and may be recognized by the user.

Meanwhile, when the second interval D2 is half or less than half the first interval D1, the end of the outermost pixel Po may be aligned with the outer surface OS of the substrate 111 or the end AAa of the display portion AA may be aligned with the outer surface OS of the substrate 111, and thus the display portion AA may be implemented (or disposed) on the entire surface of the substrate 111. Accordingly, even if a plurality of display panels 110 according to an embodiment of the present disclosure are disposed adjacently, a seam may not be recognized by a user.

The internal pixels Pi may be pixels other than the outermost pixels Po among the plurality of pixels P or pixels surrounded by the outermost pixels Po among the plurality of pixels P. The internal pixels Pi may be represented by second pixels. These internal pixels Pi may be implemented in a configuration or structure different from that of the outermost pixel Po.

Referring to FIGS. 10 and 12A, one pixel P according to an embodiment of the present disclosure may include first to fourth sub-pixels SP1, SP2, SP3, and SP4 disposed in the pixel region PA.

The first sub-pixel SP1 may be disposed in a first sub-pixel region of the pixel region PA, the second sub-pixel SP2 may be disposed in a second sub-pixel region of the pixel region PA, the third subpixel SP3 may be disposed in a third subpixel region of the pixel region PA, and the fourth subpixel SP4 may be disposed in a fourth subpixel region of the pixel region PA.

As an example, the first subpixel SP1 may be implemented to emit light of a first color, the second subpixel SP2 may be implemented to emit light of a second color, the third subpixel SP3 may be implemented to emit light of a third color, and the fourth sub-pixel SP4 may be implemented to emit light of the fourth color. Each of the first to fourth colors may be different. For example, the first color may be red, the second color may be blue, the third color may be white, and the fourth color may be green.

As another example, some of the first to fourth colors may be the same. For example, the first color may be red, the second color may be first green, the third color may be second green, and the fourth color may be blue.

Each of the first to fourth sub-pixels SP1, SP2, SP3, and SP4 may include light emitting region EA1, EA2, EA3, and EA4 and circuit regions CA1, CA2, CA3, and CA4.

The light emitting regions EA1, EA2, EA3, and EA4 may be disposed to be shifted toward the center CP of the pixel P in the sub-pixel region. For example, the light emitting regions EA1, EA2, EA3, and EA4 may be expressed as an opening region, an opening, or a light emitting portion.

According to an example, the light emitting regions EA1, EA2, EA3, and EA4 of each of the first to fourth sub-pixels SP1, SP2, SP3, and SP4 may have the same size. For example, each of the light emitting regions EA1, EA2, EA3, and EA4 of the first to fourth subpixels SP1, SP2, SP3, and SP4 may have a uniform quad structure or a uniform stripe structure. For example, the light emitting regions EA1, EA2, EA3, and EA4 having a uniform quad structure or a uniform stripe structure may have a size smaller than a quadrant size of the pixel P and may be disposed to be shifted toward CP in the sub-pixel region or may be disposed to be concentrated in the central portion CP of the pixel P.

Referring to FIGS. 10 and 12B, the light emitting regions EA1, EA2, EA3, and EA4 of each of the first to fourth subpixels SP1, SP2, SP3, and SP4 according to another example may have different sizes. For example, each of the light emitting regions EA1, EA2, EA3, and EA4 of the first to fourth subpixels SP1, SP2, SP3, and SP4 may have a non-uniform quad structure or a non-uniform stripe structure.

The size of each of the first to fourth sub-pixels SP1, SP2, SP3, and SP4 having a non-uniform quad structure (or a non-uniform stripe structure) may be set according to resolution, luminous efficiency, or image quality. As an example, when the light emitting regions EA1, EA2, EA3, and EA4 have an unequal quad structure (or unequal stripe structure), the light emitting region EA4 of the fourth subpixel SP4, among the light emitting regions EA1, EA2, EA3, and EA4 of each of the first to fourth subpixels SP1, SP2, SP3, and SP4 may have the smallest size, and the light emitting region EA3 of the third subpixel SP3 may have the largest size. For example, the light emitting regions EA1, EA2, EA3, and EA4 having a non-uniform quad structure (or a non-uniform stripe structure) may be concentrated around the central portion CP of one pixel P. In one pixel P (or pixel region PA), the central portions of the light emitting regions EA1, EA2, EA3, and EA4 are aligned with the central portion CP of the pixel P or spaced apart from the central portion CP of the pixel P.

The circuit regions CA1, CA2, CA3, and CA4 of each of the first to fourth sub-pixels SP1, SP2, SP3, and SP4 may be disposed around the corresponding light emitting regions EA1, EA2, EA3, and EA4. The circuit regions CA1, CA2, CA3, and CA4 may include a circuit for emitting a corresponding sub-pixel and pixel driving lines. For example, the circuit regions CA1, CA2, CA3, and CA4 may be expressed as a non-light-emitting region, a non-opening region, a non-light-emitting portion, a non-opening portion, or a peripheral portion.

Alternatively, in order to increase an aperture ratio of the sub-pixels SP1, SP2, SP3, and SP4 corresponding to the size of the light emitting regions EA1, EA2, EA3, and EA4 or to reduce a pixel pitch D1 according to high resolution of the pixel P, the light emitting regions EA1, EA2, EA3, and EA4 of each of the first to fourth sub-pixels SP1, SP2, SP3, and SP4 may be extended onto the circuit regions CA1, CA2, CA3, and CA4 so as to overlap some or all of the circuit regions CA1, CA2, CA3, and CA4. For example, the light emitting regions EA1, EA2, EA3, and EA4 of each of the first to fourth subpixels SP1, SP2, SP3 and SP4 may be implemented on the substrate 111 to overlap the corresponding circuit regions CA1, CA2, CA3, and CA4. In this case, the light emitting regions EA1, EA2, EA3, and EA4 may have a size which is the same as or larger than the circuit regions CA1, CA2, CA3, or CA4.

Alternatively, each of the plurality of pixels P according to another example may include first to third sub-pixels SP1, SP2, and SP3.

The light emitting regions EA1, EA2, and EA3 of each of the first to third sub-pixels SP1, SP2, and SP3 may have a rectangular shape having a shorter side parallel to the first direction (X-axis direction) and a longer side parallel to the second direction (Y-axis direction) and may be arranged, for example, in a 1×3 shape or a 1×3 stripe shape. For example, the first subpixel SP1 may be a red subpixel, the second subpixel SP2 may be a blue subpixel, and the third subpixel SP3 may be a green subpixel.

Figure 13:
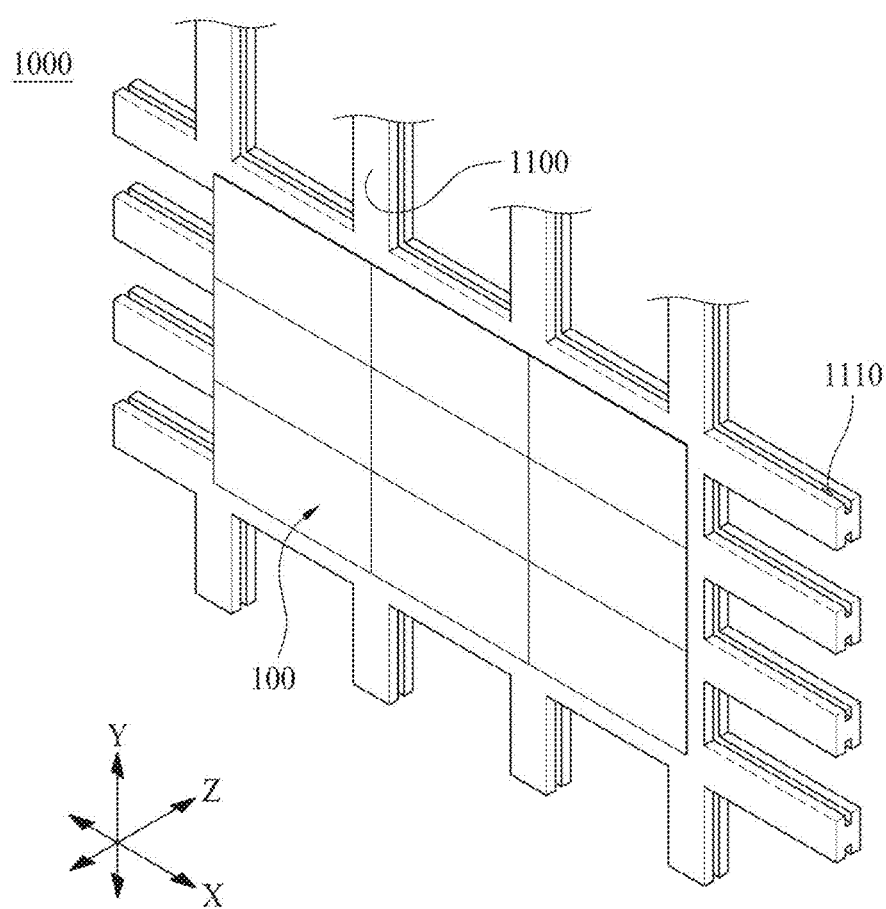
FIG. 13 is a schematic perspective view of a tiled display apparatus according to an embodiment of the present disclosure.
Figure 14A:
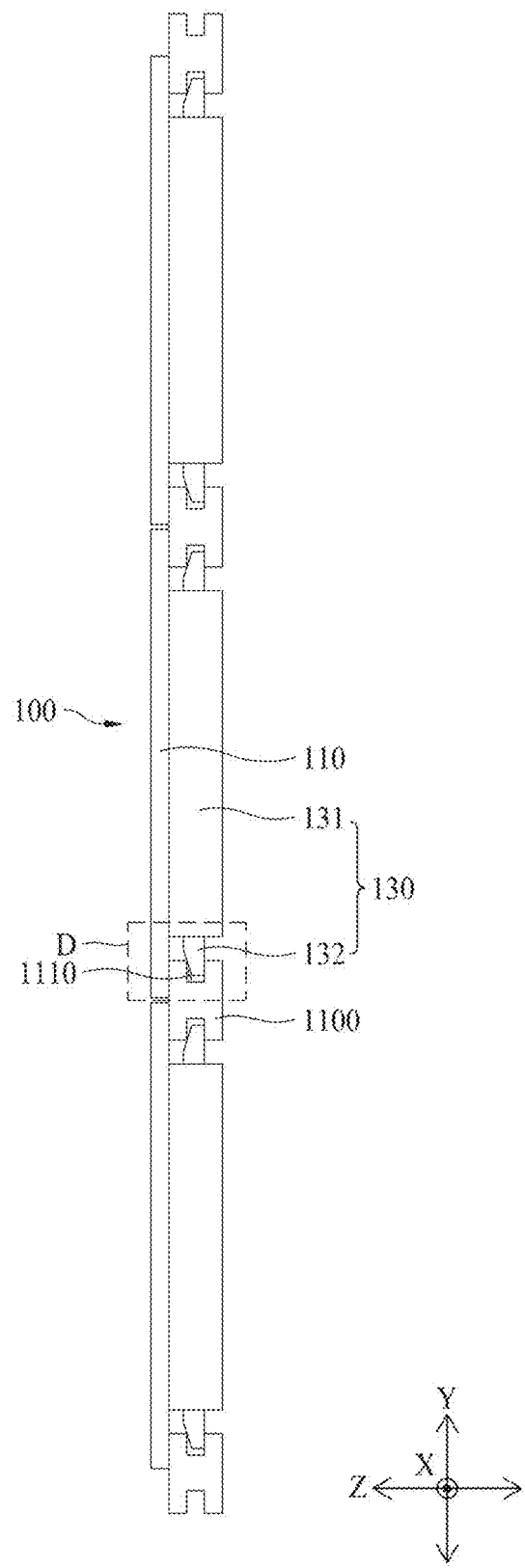
FIGS. 14A to 14C are schematic side views illustrating removal of one display apparatus from a tiled display apparatus according to an embodiment of the present disclosure.
Figure 14B:
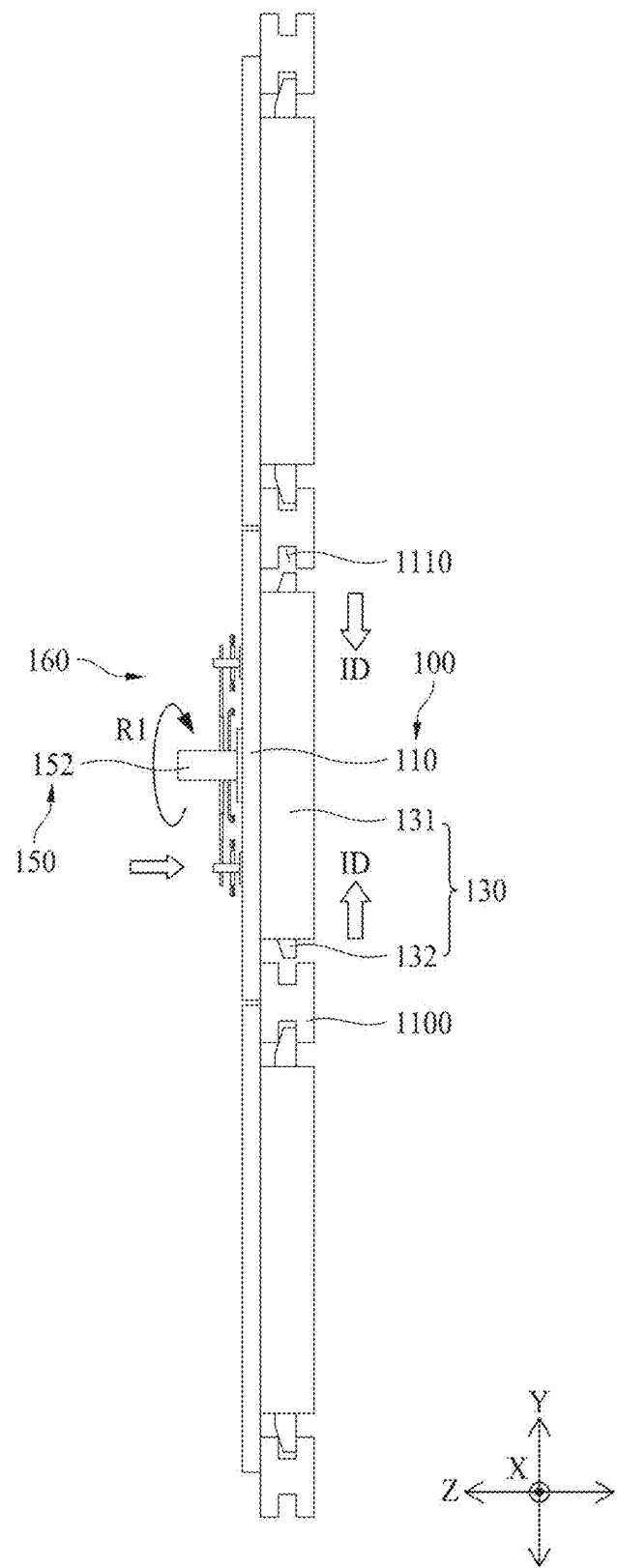
Figure 14C:
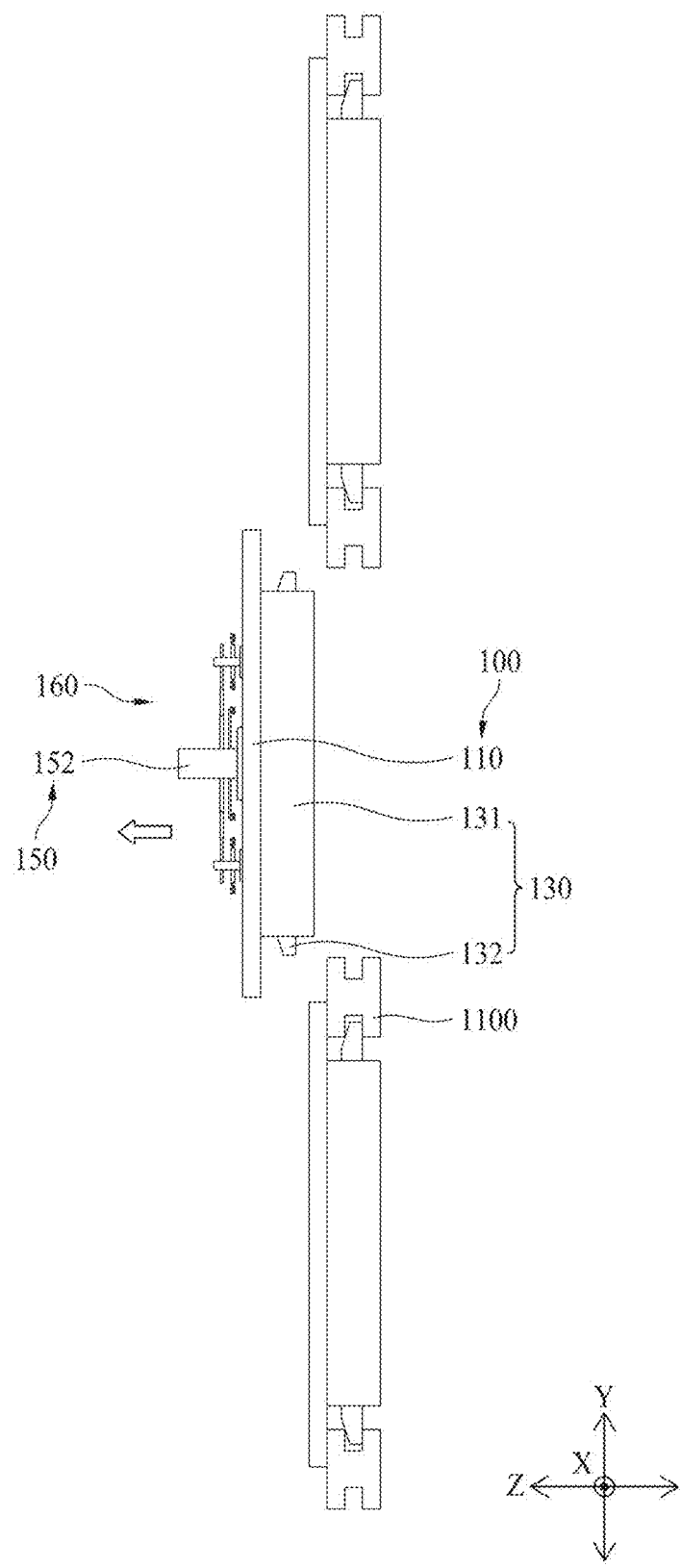

FIG. 13 is a schematic perspective view of a tiled display apparatus according to an embodiment of the present disclosure, and FIGS. 14A to 14C are schematic side views illustrating removal of one display apparatus from a tiled display apparatus according to an embodiment of the present disclosure.

Referring to FIGS. 13 to 14C, a tiled display apparatus 1000 according to an embodiment of the present disclosure may include a stand frame 1100 and a plurality of display apparatuses 100 of FIGS. 1 to 12B.

The stand frame 1100 may be supported on a floor or wall to support the display apparatus 100. As shown in FIG. 13, the stand frame 1100 may include a plurality of first frames arranged in the first direction (X-axis direction) (or horizontal direction) and a plurality of second frames arranged in the second direction (Y-axis direction) (or vertical direction).

The plurality of first frames may be arranged parallel to each other in the first direction (X-axis direction) and may be spaced apart from each other in the second direction (Y-axis direction). The plurality of second frames may be disposed parallel to each other in the second direction (Y-axis direction) and may be spaced apart from each other in the first direction (X-axis direction). The plurality of first frames and the plurality of second frames may cross each other and are integrally formed, thereby improving a bearing power for supporting the plurality of display apparatuses 100.

The plurality of first frames and the plurality of second frames may each be formed of a metal material to support the plurality of display apparatuses 100, but is not limited thereto and may be formed of any other material which may be able to support the plurality of display apparatuses 100.

The stand frame 1100 may include a guide groove 1110.

As shown in FIG. 13, the guide groove 1110 serves to insert the plurality of support portions 132 each of the plurality of display apparatuses 100. The guide groove 1110 may be provided in the form of a concave groove in the stand frame 1100. The guide groove 1110 may be formed in both the plurality of first frames and the plurality of second frames. Accordingly, when the plurality of support portions 132 are inserted into the guide groove 1110, the display apparatus 100 according to an embodiment of the present disclosure may be coupled to and installed in the stand frame 1100. When the plurality of support portions 132 are spaced apart from the guide groove 1110, the display apparatus 100 according to an embodiment of the present disclosure may be detached (or separated) from the stand frame 1100.

Hereinafter, detachment (or separation) of one display apparatus 100 from the tiled display apparatus 1000 according to an embodiment of the present disclosure will be described with reference to FIGS. 14A to 14C. Here, the plurality of display apparatuses 100 have been described by taking the display apparatus according to the second embodiment described above as an example.

FIG. 14A is a schematic side view of the tiled display apparatus 1000 according to an embodiment of the present disclosure. The plurality of display apparatuses 100 are coupled to the stand frame 1100 by the support module 130 disposed on the rear surface of the display panel 110.

More specifically, each of the plurality of display apparatuses 100 may be mounted on the stand frame 1100 by inserting the plurality of support portions 132 protruding from the body 131 into the guide groove 1110.

Next, as shown in FIG. 14B, after the integrated support mechanism 160 is attached to the front surface of the display panel 110 of the display apparatus 100 to be removed (or separated), when the support rotating shaft 152 of the support mechanism 150 is rotated in the first rotation direction (arrow direction R1), the plurality of support portions 132 may be moved in the insertion direction ID. Since the movement of the plurality of support portions 132 in the insertion direction ID has been described above with reference to FIGS. 4A, 7C, and 8A, a description thereof will be omitted.

Next, as shown in FIG. 14C, the display apparatus 100 attached to the integrated support mechanism 160 is removed (or separated) from the stand frame 1100. Accordingly, only one display apparatus 100 may be easily removed (or separated) from the tiled display apparatus 1000 according to an embodiment of the present disclosure.

A method of installing (or attaching) the display apparatus 100 to the stand frame 1100 may be performed in a reverse order of the removal (or separation) method described above.

A circuit unit and a power unit for driving the display panel 110 are installed inside the body 131 or on the rear surface of the back plate 1312, and when the display apparatus 100 is installed in the stand frame 1100, the display panel 110 may be connected to the power supply unit and the controller by a user (or an operator).

FIGS. 15A to 15D are schematic operating state views of a portion D of FIG. 14A illustrating that a position of one display apparatus is adjusted in a tiled display apparatus according to an embodiment of the present disclosure.

Figure 15A:
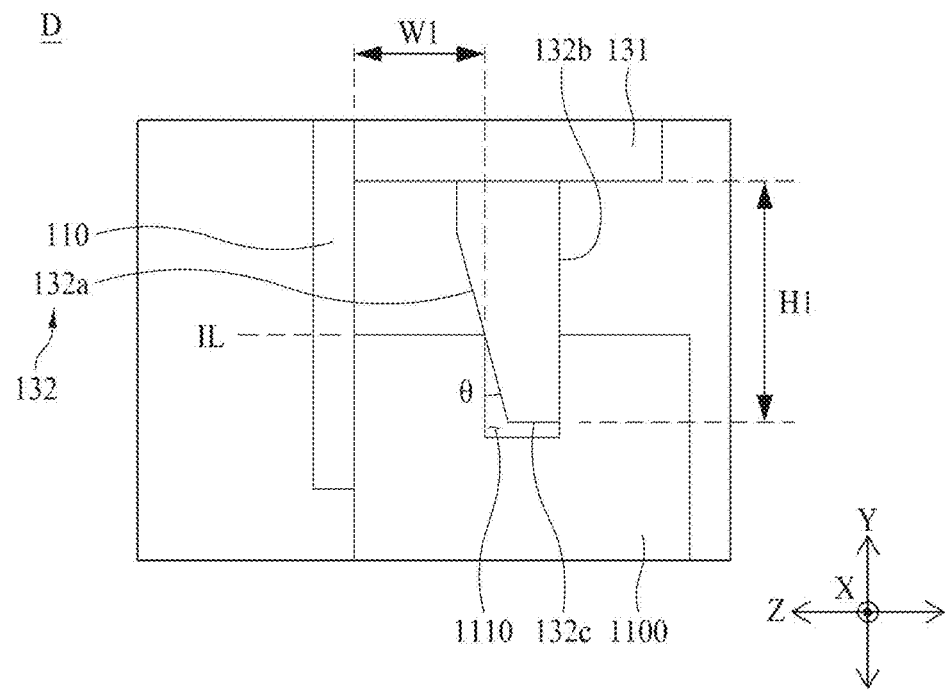
FIGS. 15A to 15D are schematic operating state views of a portion D of FIG. 14A illustrating that a position of one display apparatus is adjusted in a tiled display apparatus according to an embodiment of the present disclosure.

FIG. 15A shows that the support portion 132 of one display apparatus 100 is inserted into the guide groove 1110 of the stand frame 1100 in a state in which a plurality of display apparatuses 100 are aligned at the same interval as shown in FIG. 14a. As shown in FIG. 15A, the display apparatus 100 may be coupled to the stand frame 1100 as the support portion 132 and the rear surface of the display panel 110 are in close contact with the stand frame 1100.

The support portion 132 may be formed to decrease in size toward an outward direction (or the protrusion direction PD). Accordingly, as shown in FIG. 15A, the support portion 132 may be provided to have a predetermined angle θ with respect to the second direction (Y-axis direction). That is, the support portion 132 may include an inclined surface 132a. Referring to FIG. 15A, the support portion 132 may include the inclined surface 132a, a rear surface 132b disposed opposite to the inclined surface 132a, and a side surface (or lower surface) 132c connecting the inclined surface 132a and the rear surface 132b.

In the aligned state as shown in FIG. 15A, it is assumed that the stand frame 1100 has a first thickness W1, the support portion 132 protruding from the body 131 has a first height H1, and there is an imaginary reference line IL at a portion where the inclined surface 132a of the support portion 132 and the stand frame 1100 are in contact with each other.

In the aligned state, a portion of the support portion 132 may be inserted into the guide groove 1110, the inclined surface 132a may be in line contact with the stand frame 1100, the side surface 132c is spaced apart from the stand frame 1100 by a predetermined distance, and the rear surface 132b may be in surface contact with the stand frame 1100. However, the present disclosure is not limited thereto, and the rear surface 132b may not contact the stand frame 1100 as shown in FIG. 15D.

Meanwhile, since the rear surface of the display panel 110 is in contact with the stand frame 1100, the display panel 110 and the inclined surface 132a may be disposed to be spaced apart from each other by a first thickness W1 of the stand frame 1100 from the reference line IL. Thus, in the aligned state of FIG. 15A, the display apparatus 100 may be fixed to the stand frame 1100.

Figure 15B:
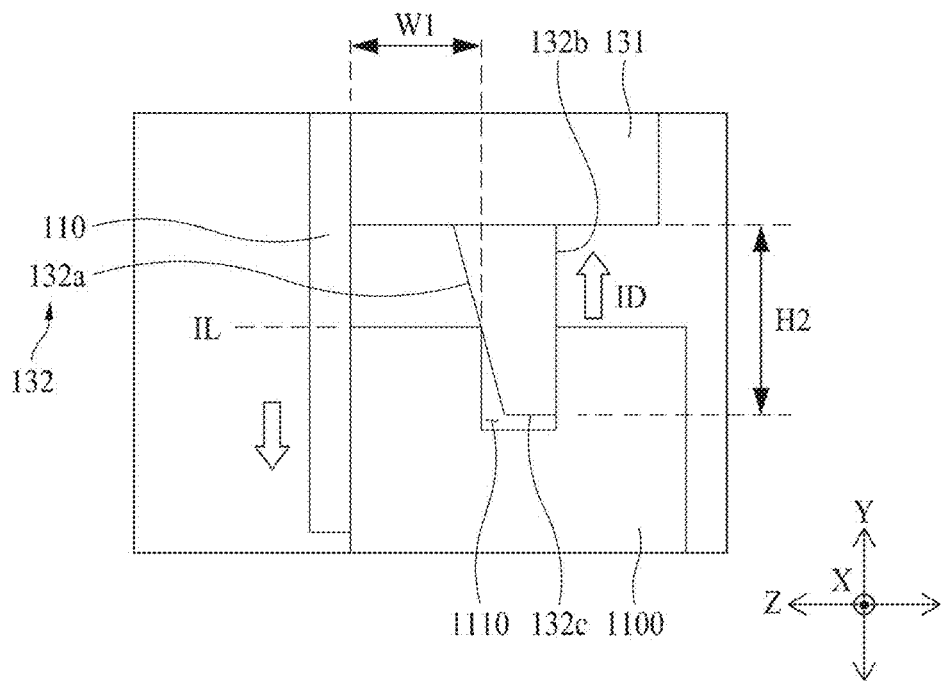

FIG. 15B shows that the display panel 110 is moved downward in the second direction (Y-axis direction) with respect to the stand frame 1100. By moving the support portion 132 in the insertion direction ID, the display panel 110 may be positioned on a lower side compared to FIG. 15A. As the support portion 132 is moved in the insertion direction ID, the support portion 132 may be positioned at a second height H2 smaller than the first height H1. Since moving the support portion 132 in the insertion direction ID may be performed by the sub-support mechanism 170 and the sub-rotating portion 138 of FIGS. 8A to 8D, a detailed description thereof will be omitted.

Figure 15C:
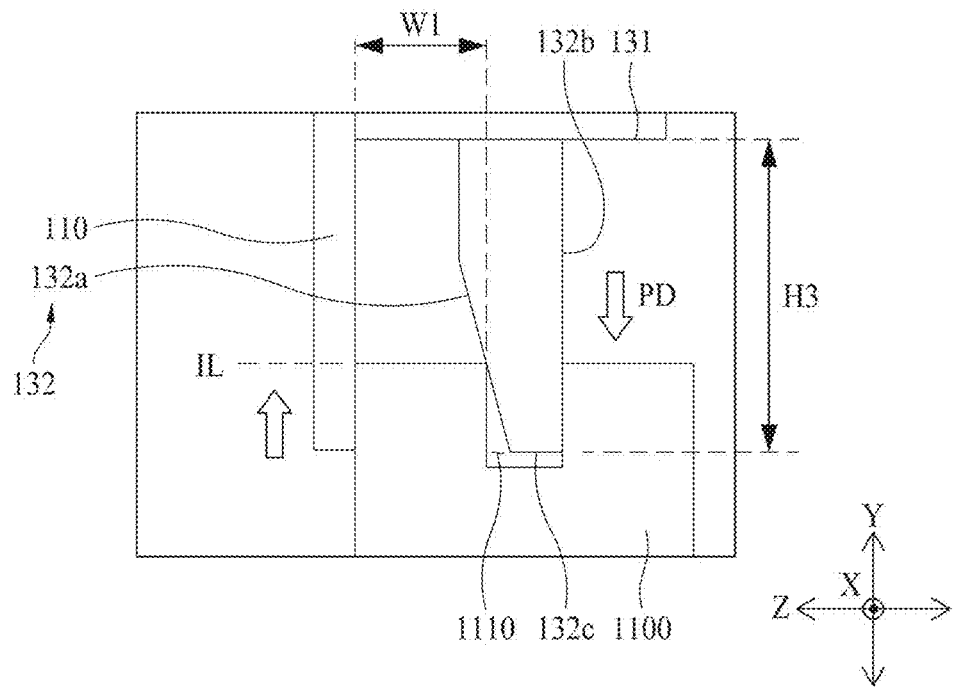
Figure 15D:
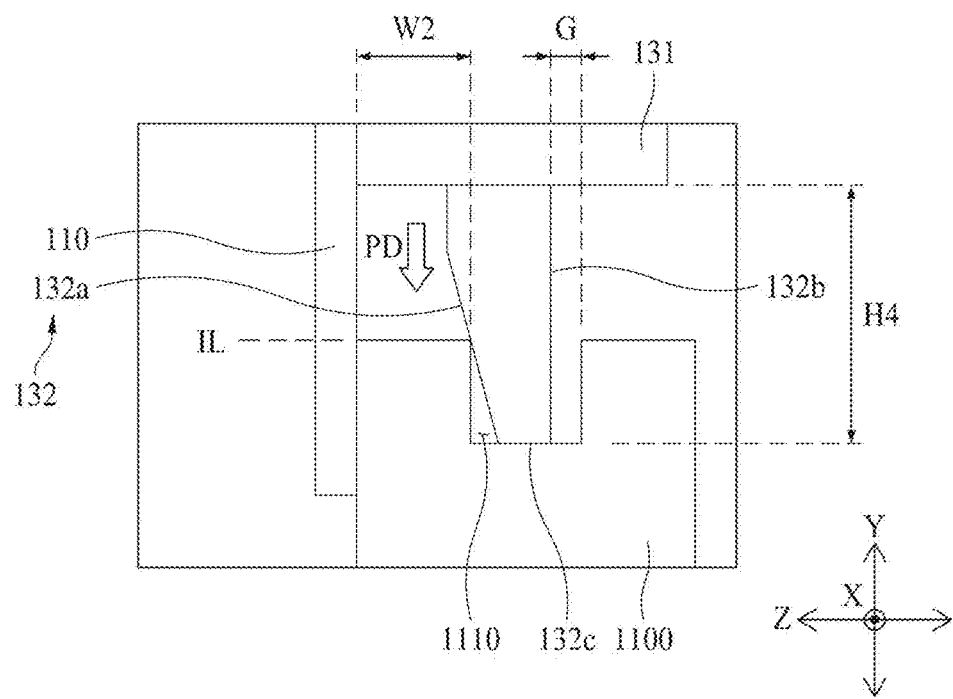

FIG. 15C shows that the display panel 110 is moved upward in the second direction (Y-axis direction) with respect to the stand frame 1100. By moving the support portion 132 in the protrusion direction PD, the display panel 110 may be positioned on an upper side compared to FIG. 15A. As the support portion 132 is moved in the protrusion direction PD, the support portion 132 may be positioned at a third height H3 greater than the first height H1. Moving the support portion 132 in the protrusion direction PD is as follows.

When the sub-support mechanism 170 is positioned on the front surface of the display panel 110 to correspond to the sub-rotating portion 138 as shown in FIG. 8C, the sub-fixing member 1385 may be spaced apart from the sub-fixing hole 1391 by an attractive force. In this state, when the sub-support rotating shaft 172 is rotated in a direction opposite to the first rotation direction (arrow direction R1), the support portion 132 may be moved in the protrusion direction PD by an elastic restoring force of the elastic member 137 supported by the support frame 136. Accordingly, as a protrusion length of the support portion 132 protruding from the body 131 may be increased as shown in FIG. 15C, the display panel 110 may be moved upward.

FIG. 15D is a view illustrating that the display apparatus 100 is coupled to the stand frame 1100 when a thickness of the stand frame 1100 is a second thickness W2 smaller than a first thickness W1.

As shown in FIG. 15D, since the thickness of the stand frame 1100 is provided with the second thickness W2, in order to fix the display apparatus 100 to the stand frame 1100, the support portion 132 moves in the protrusion direction PD to reduce a gap between the rear surface of the display panel 110 and the inclined surface 132a. Accordingly, the rear surface 132b of the support portion 132 may be spaced apart from the stand frame 1100 to have a predetermined interval G, and the side surface 132c of the support portion 132 may be in contact with the stand frame 1100. This means that, based on the assumption that the stand frame 1100 of FIGS. 15A and 15D is at the same position, the display panel 110 of FIG. 15D is moved in the third direction (Z-axis direction) toward the rear surface from the front surface of the display panel 110 than the display panel 110 of FIG. 15A. Meanwhile, as shown in FIG. 15D, as the support portion 132 is moved in the protrusion direction PD, the support portion 132 may be positioned at a fourth height H4 greater than the first height H1 of FIG. 15A.

As a result, in the tiled display apparatus 1000 according to an embodiment of the present disclosure, each of the display panel 110 may be adjusted in position in different 3-axis directions, i.e., in the first direction (X-axis direction), in the second direction (Y-axis direction), and in the third direction (Z-axis direction) according to a degree to which the plurality of support portions 132 of each of the plurality of display apparatuses 100 protrude from the body 131, and thus, the plurality of display apparatuses 100 may be positioned in an aligned state having a uniform interval, thereby implementing an image with a sense of unity. Here, the uniform interval may refer to an interval at which a seam is not recognized.

The display apparatus according to the present disclosure is provided to include a plurality of support portions movably provided from the body coupled to the display panel, so that the display panel may be easily attached to and detached from the frame, thereby reducing a time for replacement, repair, and installation work for the display panel.

In the tiled display apparatus according to the present disclosure, the position of each of the display panel supported by the frame can be adjusted by adjusting the degree to which each of the plurality of support portions protrudes from the body, so that the plurality of display apparatuses may output an image having a sense of unity.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations may be made in the display apparatus and the tiled display apparatus including the same of the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a display panel; and
a support module configured to support the display panel, wherein the support module includes:
a body configured to support the display panel;
a plurality of support portions movably coupled to the body;
a plurality of connection portions connected to the plurality of support portions, respectively; and
a rotating portion connected to the plurality of connection portions and configured to move the plurality of support portions in an insertion direction toward an inside of the body or a protrusion direction toward an outside of the body.

2. The display apparatus of claim 1, wherein the plurality of support portions includes:
a pair of horizontal axis support members movably coupled to the body in a first direction; and
a pair of vertical axis support members movably coupled in a second direction perpendicular to the first direction.

3. The display apparatus of claim 1, wherein the support module includes:
a plurality of guide frames disposed at an edge of the body and spaced apart from the rotating portion to guide the plurality of support portions, respectively;
a plurality of support frames disposed closer to the rotating portion than the plurality of guide frames and overlapping with the plurality of support portions; and
an elastic member disposed between the plurality of support frames and the plurality of guide frames.

4. The display apparatus of claim 1, wherein the rotating portion includes:
a rotating shaft disposed in a thickness direction of the display panel;
a plurality of rotating members coupled to the rotating shaft so as to rotate together with the rotating shaft; and
a plurality of magnetic members coupled to ends of the plurality of rotating members, respectively.

5. The display apparatus of claim 4, further comprising:
a support mechanism configured to rotate the rotating portion,
wherein the support mechanism includes:
a compression member compressed to a front surface of the display panel;
a support rotating shaft rotatably coupled to the compression member;
a plurality of support rotating members coupled to the support rotating shaft so as to rotate together with the support rotating shaft; and
a plurality of support magnetic members coupled to ends of the plurality of support rotating members, respectively,
wherein the plurality of support magnetic members are disposed to correspond to the plurality of magnetic members, respectively.

6. The display apparatus of claim 1, wherein the rotating portion is disposed in a center of the body and connected to each of the plurality of support portions through the connection portion.

7. The display apparatus of claim 6, wherein
the support module includes:
a plurality of sub-rotating portions disposed between the rotating portion and the plurality of support portions;
a plurality of sub-bodies to which the plurality of sub-rotating portions are rotatably coupled, respectively; and
a plurality of sub-guide holes to which the plurality of sub-bodies are movably coupled,
wherein each of the plurality of connection portions includes:
a plurality of first connection members connected to the rotating portion and each of the plurality of sub-rotating portions; and
a plurality of second connection members connected to each of the plurality of sub-rotating portions and each of the plurality of support portions.

8. The display apparatus of claim 7, wherein the plurality of sub-guide holes are arranged to face each other based on the rotating portion.

9. The display apparatus of claim 7, wherein
one side of each of the plurality of first connection members is connected to a rotation surface of the rotating portion and the other side thereof is connected to a sub-rotating shaft of each of the plurality of sub-rotating portions, and
one side of each of the plurality of second connection members is connected to a rotation surface of the sub-rotating shaft of each of the plurality of sub-rotating portions and the other side thereof is connected to each of the plurality of support portions.

10. The display apparatus of claim 9, wherein each of the plurality of first connection members is connected to be spaced apart from the rotation surface of the rotating portion.

11. The display apparatus of claim 7, wherein
the sub-rotating portion includes:
a sub-rotating shaft rotatably coupled to the sub-body;
a plurality of sub-rotating members coupled to the sub-rotating shaft so as to rotate together with the sub-rotating shaft;
a plurality of sub-magnetic members coupled to ends of the plurality of sub-rotating members, respectively;
a sub-elastic member disposed on one side of the sub-rotating shaft; and
a sub-fixing member disposed on the other side of the sub-rotating shaft,
wherein the sub-fixing member is inserted into a sub-fixing hole formed in the sub-body or spaced apart from the sub-fixing hole according to movement of the sub-rotating shaft in a thickness direction of the display panel by the stretchability and contraction of the sub-elastic member.

12. The display apparatus of claim 7, further comprising:
a plurality of sub-support mechanisms configured to rotate the plurality of sub-rotating portions, respectively,
wherein each sub-support mechanism includes:
a sub-compression member compressed to a front surface of the display panel;
a sub-support rotating shaft rotatably coupled to the sub-compression member;
a plurality of sub-support rotating members coupled to the sub-support rotating shaft so as to rotate together with the sub-support rotating shaft; and
a plurality of sub-support magnetic members coupled to ends of the plurality of sub-support magnetic member, respectively,
wherein the plurality of sub-support magnetic members are disposed to correspond to each of the plurality of sub-magnetic members of each of the plurality of sub-rotating portions.

13. The display apparatus of claim 12, wherein
the plurality of sub-support rotating members includes:
a first support frame coupled to the sub-support rotating shaft; and
a second support frame rotatably coupled to the first support frame,
wherein the plurality of sub-support magnetic members are coupled to an end of the second support frame, and
the second support frame is rotated in a second rotation direction perpendicular to a first rotation direction of the sub-support rotating shaft.

14. The display apparatus of claim 7, further comprising:
a plurality of fixing portions disposed not to overlap with a imaginary line connecting the rotating portion and the plurality of sub-rotating portions,
wherein one side of each of the plurality of first connection members is connected to a rotation surface of the rotating portion and the other side thereof is fixed to the plurality of fixing portions, and
each of the plurality of sub-rotating portions is in contact with a plurality of first connection members between one side and the other side of each of the plurality of first connection members.

15. The display apparatus of claim 1, wherein
a size of each of the plurality of support portions is reduced toward the protrusion direction.

16. The display apparatus of claim 1, wherein
the display panel includes:
a substrate; and
a display unit having a plurality of pixels arranged on the substrate,
wherein a size of the display unit is equal to a size of the substrate.

17. The display apparatus of claim 16, wherein
the plurality of pixels are arranged at a first interval on the substrate,
the first interval is a distance between centers of two adjacent pixels, and
a second interval between centers of outermost pixels among the plurality of pixels and an outer surface of the substrate is a half or less of the first interval.

18. A tiled display apparatus comprising:
a stand frame; and
a plurality of display apparatuses individually tiled to the stand frame,
wherein each of the plurality of display apparatuses includes the display apparatus of claim 1.

19. The tiled display apparatus of claim 18, wherein the stand frame includes a guide groove into which a plurality of support portions of each of the plurality of display apparatuses are inserted.

20. The tiled display apparatus of claim 19, wherein a display panel of each of the plurality of display apparatuses is adjusted in position in different 3-axis directions according to the degree to which the plurality of support portions protrude from the body.

\* \* \* \* \*